(12) United States Patent
Julstrom et al.

(10) Patent No.: US 8,022,775 B2
(45) Date of Patent: Sep. 20, 2011

(54) SYSTEMS AND METHODS FOR MAINTAINING A DRIVE SIGNAL TO A RESONANT CIRCUIT AT A RESONANT FREQUENCY

(75) Inventors: Stephen Drake Julstrom, Chicago, IL (US); Timothy Scott Monroe, Schaumburg, IL (US)

(73) Assignee: Etymotic Research, Inc., Elk Grove Village, IL (US)

( * ) Notice: Subject to any disclaimer, the term of this patent is extended or adjusted under 35 U.S.C. 154(b) by 113 days.

(21) Appl. No.: 12/576,065

(22) Filed: Oct. 8, 2009

(65) Prior Publication Data

US 2011/0084752 A1 Apr. 14, 2011

(51) Int. Cl.
*H03L 7/085* (2006.01)
(52) U.S. Cl. ............... 331/25; 331/1 R; 327/156
(58) Field of Classification Search ............ 331/1 R, 331/17, 18, 25, 74, 77; 327/156; 320/108
See application file for complete search history.

(56) References Cited

U.S. PATENT DOCUMENTS

| | | |
|---|---|---|
| 2,415,688 A | 2/1947 | Hall, Jr. |
| 3,274,631 A | 9/1966 | Spohr |
| 3,414,796 A | 12/1968 | Henquet |
| 3,840,795 A | 10/1974 | Roszyk et al. |
| 3,867,950 A | 2/1975 | Fischell |
| 3,938,018 A | 2/1976 | Dahl |
| 4,031,449 A | 6/1977 | Trombly |
| 4,379,988 A | 4/1983 | Mattatall |
| 4,423,456 A | 12/1983 | Zaidenweber |
| 4,577,145 A | 3/1986 | Mullersman |
| 4,800,328 A | 1/1989 | Bolger et al. |
| 4,833,337 A | 5/1989 | Kelley et al. |
| 4,873,677 A | 10/1989 | Sakamoto et al. |
| 4,908,869 A | 3/1990 | Lederman |
| 4,912,391 A | 3/1990 | Meadows |
| 5,070,293 A | 12/1991 | Ishii et al. |
| 5,216,402 A | 6/1993 | Carosa |
| 5,264,776 A | 11/1993 | Hulsey |
| 5,323,099 A | 6/1994 | Bruni et al. |
| 5,341,083 A | 8/1994 | Klontz et al. |
| 5,396,538 A | 3/1995 | Hong |
| 5,455,466 A | 10/1995 | Parks et al. |
| 5,467,718 A | 11/1995 | Shibata et al. |
| 5,550,452 A | 8/1996 | Shirai et al. |

(Continued)

OTHER PUBLICATIONS http://www.witricitypower.com, 2007.

(Continued)

*Primary Examiner* — Ryan Johnson
(74) *Attorney, Agent, or Firm* — McAndrews, Held & Malloy, Ltd.

(57) ABSTRACT

Systems and methods for maintaining a drive signal to a resonant circuit at a resonant frequency are provided. A system for maintaining a drive signal to a resonant circuit at a resonant frequency can include: an oscillator configured to provide an output to a phase comparator and a drive circuit, the drive circuit configured to provide a drive signal to a resonant circuit; a phase detector configured to receive a filtered version of the drive signal from the resonant circuit and provide a phase-indicating signal to the phase comparator; and the phase comparator, wherein the phase comparator is configured to provide a signal based on the phase difference between the oscillator output and the phase-indicating signal, wherein the signal from the phase comparator is used to control the frequency of the oscillator such that the phase difference converges to a fixed value.

36 Claims, 22 Drawing Sheets

U.S. PATENT DOCUMENTS

| | | | |
|---|---|---|---|
| 5,568,036 | A | 10/1996 | Hulsey et al. |
| 5,594,317 | A | 1/1997 | Yeow et al. |
| 5,600,225 | A | 2/1997 | Goto |
| 5,623,550 | A | 4/1997 | Killion |
| 5,952,814 | A | 9/1999 | Van Legerghe |
| 5,959,433 | A | 9/1999 | Rohde |
| 5,966,641 | A | 10/1999 | Flowerdew |
| 6,028,413 | A | 2/2000 | Brockmann |
| 6,040,680 | A | 3/2000 | Toya et al. |
| D423,028 | S | 4/2000 | Okura et al. |
| 6,100,663 | A | 8/2000 | Boys et al. |
| 6,118,249 | A | 9/2000 | Brockmann et al. |
| 6,134,420 | A | 10/2000 | Flowerdew et al. |
| 6,157,252 | A | 12/2000 | Compton et al. |
| 6,184,651 | B1 | 2/2001 | Fernandez et al. |
| 6,208,115 | B1 | 3/2001 | Binder |
| 6,275,681 | B1 | 8/2001 | Vega et al. |
| 6,292,104 | B1 * | 9/2001 | Wakabayashi ................ 340/612 |
| 6,301,128 | B1 | 10/2001 | Jang et al. |
| 6,436,299 | B1 | 8/2002 | Baarman et al. |
| 6,489,745 | B1 | 12/2002 | Koreis |
| 6,498,455 | B2 | 12/2002 | Zink et al. |
| 6,498,456 | B2 | 12/2002 | Ettes et al. |
| 6,504,732 | B2 | 1/2003 | Abe |
| 6,636,017 | B2 | 10/2003 | Zink et al. |
| 6,658,124 | B1 | 12/2003 | Meadows |
| 6,661,197 | B2 | 12/2003 | Zink et al. |
| 6,673,250 | B2 | 1/2004 | Kuennen et al. |
| 6,731,071 | B2 | 5/2004 | Baarman |
| 6,803,744 | B1 | 10/2004 | Sabo |
| 6,806,649 | B2 | 10/2004 | Mollema et al. |
| 6,812,645 | B2 | 11/2004 | Baarman |
| 6,825,620 | B2 | 11/2004 | Kuennen et al. |
| 6,831,417 | B2 | 12/2004 | Baarman |
| 6,844,702 | B2 | 1/2005 | Giannopoulos et al. |
| 6,906,495 | B2 | 6/2005 | Cheng et al. |
| 6,913,477 | B2 | 7/2005 | Dayan et al. |
| 6,917,163 | B2 | 7/2005 | Baarman |
| 6,934,167 | B2 | 8/2005 | Jang et al. |
| 6,972,543 | B1 | 12/2005 | Wells |
| 6,975,198 | B2 | 12/2005 | Baarman et al. |
| 7,042,196 | B2 | 5/2006 | Ka-Lai et al. |
| 7,116,200 | B2 | 10/2006 | Baarman et al. |
| 7,118,240 | B2 | 10/2006 | Baarman et al. |
| 7,126,450 | B2 | 10/2006 | Baarman et al. |
| 7,132,918 | B2 | 11/2006 | Baarman et al. |
| 7,164,255 | B2 | 1/2007 | Hui |
| 7,180,265 | B2 | 2/2007 | Naskali et al. |
| 7,180,503 | B2 | 2/2007 | Burr et al. |
| 7,206,426 | B1 | 4/2007 | Julstrom et al. |
| 7,211,986 | B1 | 5/2007 | Flowerdew et al. |
| 7,239,110 | B2 | 7/2007 | Cheng et al. |
| 7,248,017 | B2 | 7/2007 | Cheng et al. |
| 7,262,700 | B2 | 8/2007 | Hsu |
| 7,274,168 | B2 | 9/2007 | Tskukamoto et al. |
| 7,279,843 | B2 | 10/2007 | Baarman et al. |
| 7,349,741 | B2 | 3/2008 | Maltan et al. |
| 7,375,492 | B2 | 5/2008 | Calhoon et al. |
| 7,375,493 | B2 | 5/2008 | Calhoon et al. |
| 7,382,636 | B2 | 6/2008 | Baarman et al. |
| 7,385,357 | B2 | 6/2008 | Kuennen et al. |
| 7,462,951 | B1 | 12/2008 | Baarman |
| 2003/0210106 | A1 | 11/2003 | Cheng et al. |
| 2003/0214255 | A1 | 11/2003 | Baarman et al. |
| 2004/0130915 | A1 | 7/2004 | Baarman |
| 2004/0130916 | A1 | 7/2004 | Baarman |
| 2004/0150934 | A1 | 8/2004 | Baarman |
| 2004/0222751 | A1 | 11/2004 | Mollema |
| 2004/0232845 | A1 | 11/2004 | Baarman et al. |
| 2005/0007067 | A1 | 1/2005 | Baarman |
| 2005/0093475 | A1 | 5/2005 | Kuennen |
| 2005/0116650 | A1 | 6/2005 | Baarman |
| 2005/0116683 | A1 | 6/2005 | Cheng et al. |
| 2005/0122058 | A1 | 6/2005 | Baarman |
| 2005/0122059 | A1 | 6/2005 | Baarman |
| 2005/0127849 | A1 | 6/2005 | Baarman |
| 2005/0127850 | A1 | 6/2005 | Baarman |
| 2006/0043927 | A1 | 3/2006 | Beart et al. |
| 2006/0061323 | A1 | 3/2006 | Cheng et al. |
| 2006/0132045 | A1 | 6/2006 | Baarman |
| 2008/0036504 | A1 * | 2/2008 | Paull ................................ 327/5 |

OTHER PUBLICATIONS

Jang, Yungtaek, et al., "A Contactless Electrical Energy Transmission System for Portable-Telephone Battery Chargers," IEEE Transactions on Industrial Electronics, vol. 50, No. 3, Jun. 2003.

Pedder, Don A., et al., "A Contactless Electrical Energy Transmission System," IEEE Transactions on Industrial Electronics, vol. 46, No. 1, Feb. 1999.

Wikipedia, Electromagnetic induction, pp. 1-3, Aug. 31, 2010. http://www.en.wikipedia.org/wiki/Electromagnetic_induction.

Pure Energy Solutions, Latest News—Pure Energy Solutions Announces Partnership with Electric-Cable Assemblies, pp. 1-2, http://www.shoppureenergy.com , Retrieved Sep. 2010.

Powermat USA, Wireless charging mats and receivers for your iPhone, iPod, Blackberry . . . , p. 1, http://www.powermat.com/us/home., Retrieved Sep. 2010.

WiPower, The Leader in Wireless Power Systems, Drop, charge, go, p. 1, http://www.wipower.com , Retrieved Sep. 2010.

WiTricity, Wireless Electricity Delivered Over Distance, p. 1, Oct. 2009. http://www.witricity.com , Retrieved Sep. 2010.

* cited by examiner

Relative fundamental output varied by drive invert signal drive invert count (main counter from 0 to 63)

SYSTEMS AND METHODS FOR MAINTAINING A DRIVE SIGNAL TO A RESONANT CIRCUIT AT A RESONANT FREQUENCY

CROSS-REFERENCE TO RELATED APPLICATIONS/INCORPORATION BY REFERENCE

U.S. Pat. No. 5,623,550 issued to Killion on Apr. 22, 1997 is incorporated herein by reference in its entirety.

U.S. Pat. No. 7,206,426 issued to Julstrom et al. on Apr. 17, 2007 is incorporated herein by reference in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

An electrical transformer transfers power from a primary winding to a secondary winding through the interaction of the windings' magnetic fields, with no conductive electrical contact. For many years, the notion of transferring power magnetically from a primary winding to a physically separable secondary winding has intrigued inventors. Reasons for coupling power magnetically include the safety and convenience of avoiding open electrical contacts and degradation that can afflict those contacts.

Such technology has been utilized to recharge batteries in portable devices. For example, one application is in connection with recharging an electric toothbrush, as described, for example, in U.S. Pat. No. 3,840,795 issued to Roszyk et al. During charging, the primary coil in the toothbrush's charging stand is in a close and predetermined physical relationship with the secondary coil in the handheld unit to be recharged. It has been found that using close and predetermined positioning can provide a tight, transformer-like magnetic coupling. This concept has also been applied in connection with recharging wireless telephones, as described, for example, in U.S. Pat. No. 5,396,538 issued to Hong.

The relatively tight magnetic coupling of primary and secondary windings in known arrangements is provided by the precise physical relationship between the charging unit and the receiving unit. However, difficulty arises when attempting to provide a magnetic power source device that can couple with a variety of receiving devices without utilizing a close and predetermined physical relationship. In other words, when the precise physical relationship between the primary and the secondary is not known, tight magnetic coupling may not be achieved. For example, much of the magnetic flux produced by the primary winding may not be coupled to the secondary winding, thereby reducing the efficiency of power transfer and making the task of creating a sufficiently strong magnetic field in the vicinity of the secondary winding more difficult. Also, the strength of the field reaching the secondary winding can vary considerably with changes in the secondary winding's position relative to the primary winding.

There have been attempts to provide uniform magnetic fields in order to improve coupling where the physical relationship between a primary and secondary winding is not specifically predetermined. See, for example, U.S. Pat. No. 6,906,495 issued to Cheng et al. and U.S. Pat. No. 7,211,986 issued to Flowerdew and Huddart. However, in such schemes, a decreasing portion of the generated magnetic field couples to the secondary winding as the physical configuration becomes more general (less specific) and more removed from the condition of a close primary-secondary coupling. In other words, it is desirable to improve coupling where the physical relationship between a primary and secondary winding is not specifically predetermined.

Relatively poor coupling can be represented in a transformer model by reduced primary to secondary mutual inductance and a corresponding increase in the series leakage inductances. In many such cases of imperfect coupling, the amount of magnetic flux that does not link the windings (and therefore contributes to the leakage inductances) can be significant in comparison to the flux that does link the windings (and therefore can transfer power). The voltage drops from the series impedances of the primary and secondary leakage inductances and the associated reactive driving power can be reduced by resonating the primary or secondary winding, or both, with associated capacitors.

There have been attempts to improve coupling efficiency by maintaining at least an approximate match between the drive frequency associated with a primary circuit and the resonance of the primary and/or secondary circuits. See, for example, U.S. Pat. Nos. 6,028,413 issued to Brockmann, 6,825,620 issued to Keunnen et al., 6,906,495 issued to Cheng et al., 7,211,986 issued to Flowerdew et al. 6,972,543 issued to Wells; and "A Contactless Electrical Energy Transmission System", IEEE Transactions on Industrial Electronics, vol. 46, pp. 23-30, February 1999 by Pedder et al. However, known approaches may be complex and/or may not provide desired results. In other words, it is desirable to provide improved systems and methods that can maintain at least an approximate match between the drive frequency associated with a primary circuit and the resonance of the primary and/or secondary circuits.

There have been attempts to provide inductively rechargeable batteries that include a secondary winding for inductively receiving charging power from a primary winding. See, for example, U.S. Pat. Nos. 6,208,115 issued to Binder, 6,498, 455 issued to Zink et al., 6,906,495 issued to Cheng et al. However, it has been discovered that known systems and methods do not address power losses associated with shunting of the magnetic path by the storage cell materials or reducing potential losses from the flux-concentrating magnetic material itself. Providing an inductively rechargeable battery that addresses such issues is desirable. Further, providing an inductively rechargeable battery with improved volumetric efficiency is also desirable.

There have been attempts to provide control over the charging process by allowing a battery to communicate its charging needs to primary side circuitry. See, for example, U.S. Pat. Nos. 5,396,538 issued to Hong, 5,952,814 issued to Van Lerberghe, 6,118,249 issued to Brockmann et al. However, known systems and methods do not provide for battery charge need sensing that is simply implemented, does not require additional data paths, and does not significantly interfere with the charging operation. Providing an inductively rechargeable battery system that addresses such issues is desirable.

SUMMARY OF THE INVENTION

Certain embodiments of the present technology provide inductively coupled battery charging systems and methods. Certain embodiments provide systems and methods for maintaining a drive signal to a resonant circuit at a resonant frequency. Certain embodiments provide rechargeable battery assemblies and methods of constructing rechargeable battery assemblies.

Certain embodiments provide an inductively coupled battery charging system comprising: transmit circuitry comprising a transmit coil, wherein the transmit coil is operatively part of a transmit resonant circuit that exhibits resonance at a transmit resonant frequency, wherein the transmit resonant circuit exhibits an unloaded Q value of at least about 20, and wherein the transmit circuitry is configured to produce alternating current in the transmit coil to generate a magnetic field at about the transmit resonant frequency; and a rechargeable battery assembly comprising a storage cell and receive circuitry, the receive circuitry comprising a receive coil operatively connected to receive control circuitry, wherein the receive coil is configured to receive inductively coupled current, wherein the receive control circuitry is configured to rectify the current and communicate charging power to the storage cell, wherein the receive coil is operatively part of a receive resonant circuit that exhibits resonance at a receive resonant frequency, and wherein the receive resonant circuit exhibits an unloaded Q value of at least about 10, and wherein the transmit resonant frequency and the receive resonant frequency are about equal.

Certain embodiments provide a method for inductively charging a battery comprising: using transmit circuitry in a transmitter to produce alternating current in a transmit coil to generate a magnetic field at about a transmit resonant frequency, wherein the transmit coil is operatively part of a transmit resonant circuit that exhibits resonance at the transmit resonant frequency, and wherein the transmit resonant circuit exhibits an unloaded Q value of at least about 20; using a receive coil in a rechargeable battery assembly to receive inductively coupled current; and using receive circuitry to rectify the current and communicate charging power to a storage cell, wherein the receive coil is operatively part of a receive resonant circuit that exhibits resonance at a receive resonant frequency, wherein the receive resonant circuit exhibits an unloaded Q value of at least about 10, and wherein the receive resonant frequency is about equal to the transmit resonant frequency.

In certain embodiments, the transmit resonant circuit exhibits an unloaded Q value of at least about 60.

In certain embodiments, the transmit and receive resonant frequencies are in the range of about 15 kHz to 100 kHz.

In certain embodiments, the transmit and receive resonant frequencies are about 23 kHz.

In certain embodiments, the transmit and receive resonant frequencies are greater than 100 kHz.

In certain embodiments, the storage cell comprises a nickel metal hydride cell.

In certain embodiments, the storage cell comprises a plurality of cells. In certain embodiments, the transmit coil is wound around a ferrite core.

In certain embodiments, the receive coil is wound around a metal shield/core.

In certain embodiments, the receive coil is wound around a metal shield/core, the metal shield/core comprising a cobalt-based alloy comprising a cobalt content greater than 50%.

In certain embodiments, the transmit resonant circuit comprises at least one transmit capacitor effectively in series with the transmit coil, and wherein the transmit capacitor includes a dielectric that comprises polypropylene.

In certain embodiments, the receive resonant circuit comprises a receive capacitor in series with the receive coil, and wherein the receive capacitor includes a dielectric that comprises polyphenylene sulphide.

In certain embodiments, the transmit circuitry includes a second transmit coil that is operatively part of a second transmit resonant circuit that exhibits resonance at about the transmit resonant frequency, wherein the transmit circuitry is configured to produce alternating current in the second transmit coil to generate a second magnetic field at about the transmit resonant frequency, wherein the transmit circuitry is configured to determine which of the magnetic field and the second magnetic field is more strongly coupled to the receive coil, and wherein the transmit circuitry is configured to discontinue at least temporarily production of alternating current in the coil generating the field that is not as strongly coupled to the receive coil.

In certain embodiments, the first and second transmit coils comprise split windings that are wound onto a core comprising four ends such that the windings of the coils are concentrated toward the ends of the core, and such that the coils cross toward a center of the core.

In certain embodiments, the first and second transmit coils comprise split windings that are wound onto a core comprising four ends, wherein the four ends comprise end risers.

In certain embodiments, the first and second transmit coils are wound onto a disc-shaped core, and wherein the first and second transmit coils are oriented orthogonally to each other.

In certain embodiments, the disc-shaped core comprises circumferential end risers.

In certain embodiments, the first and second transmit coils are split wound onto the disc-shaped core.

In certain embodiments, the transmit circuitry includes a third transmit coil that is operatively part of a third transmit resonant circuit that exhibits resonance at about the transmit resonant frequency, wherein the transmit circuitry is configured to produce alternating current in the third transmit coil to generate a third magnetic field at about the transmit resonant frequency, wherein the transmit circuitry is configured to determine which of the magnetic field, the second magnetic field and the third magnetic field is most strongly coupled to the receive coil, and wherein the transmit circuitry is configured to discontinue at least temporarily production of alternating current in the coils generating the fields that are not the most strongly coupled to the receive coil.

In certain embodiments, the first, second, and third transmit coils are wound onto a disc-shaped core, wherein the first and second transmit coils are oriented orthogonally to each other, and wherein the third transmit coil is wound around a circumferential periphery of the disc-shaped core.

In certain embodiments, the disc-shaped core comprises circumferential end risers.

In certain embodiments, the first and second transmit coils are split wound onto the disc-shaped core.

In certain embodiments, the transmit coil comprises a split winding around a core with a first end and a second end such that the windings of the coil are concentrated toward the ends of the core, thereby leaving a winding gap.

In certain embodiments, the transmit coil comprises a core with a first end and a second end and vertical risers at each end of the core.

Certain embodiments provide an inductively coupled battery charging system wherein the transmit circuitry is configured to maintain the magnetic field at about the transmit resonant frequency.

Certain embodiments provide a method for inductively charging a battery wherein the transmit circuitry is configured to maintain the magnetic field at about the transmit resonant frequency.

In certain embodiments, the transmit circuitry is configured to maintain the magnetic field at about the transmit resonant frequency by maintaining about a ninety degree phase shift between a square wave input and a square wave output, the square wave input being provided to a drive circuit configured to provide a pulse waveform to the transmit resonant circuit, and the square wave output being provided from a phase detector configured to receive a low-pass filtered version of the pulse waveform from the transmit resonant circuit.

In certain embodiments, the transmit circuitry is configured to maintain the magnetic field at about the transmit resonant frequency by maintaining about a ninety degree phase shift between a square wave input and a square wave output, the square wave input being provided from an oscillator to a phase comparator and to a drive circuit configured to provide a pulse waveform to the transmit resonant circuit, and the square wave output being provided to the phase comparator from a phase detector configured to receive a low-pass filtered version of the pulse waveform from the transmit resonant circuit, wherein the phase comparator provides a signal based on the phase difference between the square wave input and the square wave output, and wherein the signal from the phase comparator is used to adjust the oscillator such that there is about a ninety degree phase shift between the square wave input and the square wave output.

In certain embodiments, the transmit circuitry is configured to maintain the magnetic field at about the transmit resonant frequency by maintaining about a ninety degree phase shift between a square wave input and a square wave output, the square wave input being provided to a low-pass filter with a characteristic frequency that is about the same as the transmit resonant frequency of the transmit resonant circuit, and the square wave output being provided from a phase detector configured to receive a filtered signal from the low-pass filter.

In certain embodiments, the transmit circuitry is configured to maintain the magnetic field at about the transmit resonant frequency by maintaining about a ninety degree phase shift between a square wave input and a square wave output, the square wave input being provided from an oscillator to a phase comparator and to a low-pass filter with a characteristic frequency that is about the same as the transmit resonant frequency of the transmit resonant circuit, and the square wave output being provided from a phase detector configured to receive a filtered signal from the low-pass filter, wherein the phase comparator provides a signal based on the phase difference between the square wave input and the square wave output, and wherein the signal from the phase comparator is used to adjust the oscillator such that there is about a ninety degree phase shift between the square wave input and the square wave output.

In certain embodiments, the transmit circuitry is configured to regulate the alternating current produced in the transmit coil based on a current flowing in the transmit resonant circuit, wherein a drive signal applied to the transmit resonant circuit is increased if the current flowing in the transmit resonant circuit is below a target current, and wherein the drive signal applied to the transmit resonant circuit is decreased if the current flowing in the transmit resonant circuit is above the target current.

In certain embodiments, the transmit circuitry includes a processor that utilizes pulse-width modulation to vary an effective level of the drive signal applied to the transmit resonant circuit.

In certain embodiments, the transmit circuitry includes a processor that can vary a drive pulse amplitude of the drive signal applied to the transmit resonant circuit in order to vary an effective level of the drive signal.

In certain embodiments, the transmit circuitry includes a processor that utilizes pulse-width modulation to vary an effective level of the drive signal applied to the transmit resonant circuit, and wherein the processor can vary a drive pulse amplitude of the drive signal applied to the transmit resonant circuit in order to vary the effective level of the drive signal.

In certain embodiments, the pulse-width modulation operates so as to maintain a fixed relationship between a fundamental frequency component of the drive signal and a fundamental frequency component of a reference signal.

In certain embodiments, the drive pulse amplitude is a voltage and wherein the drive pulse amplitude voltage ranges from about 10 volts to about 40 volts.

In certain embodiments, the transmitter includes a light configured to provide varying brightness based on an effective level of the drive signal.

Certain embodiments provide an inductively coupled battery charging system wherein the transmit circuitry is configured to detect the rechargeable battery assembly by monitoring a load on the transmit coil.

Certain embodiments provide a method for inductively charging a battery comprising using the transmit circuitry to detect the rechargeable battery assembly by monitoring a load on the transmit coil.

In certain embodiments, the transmit coil is used to produce the alternating magnetic field in the vicinity of the rechargeable battery assembly in response to a drive signal to the transmit resonant circuit from the transmit circuitry, wherein the transmit circuitry is configured to periodically apply the drive signal, thereby creating a resonant voltage across the transmit coil, wherein the receive circuitry includes a switch that can allow power to be communicated to the storage cell when the alternating magnetic field is generated in the vicinity of the receive coil, wherein the load on the transmit coil is increased when the switch allows power to be communicated to the storage cell, and wherein the transmit circuitry is configured to monitor the load on the transmit coil such that if the load is increased, the transmit circuitry can provide charging, and if the load is not increased, the transmit circuitry can remove the drive signal.

In certain embodiments, the load increase is sensed through a decrease in the resonant voltage.

In certain embodiments, the load increase is sensed through a decrease in the current flowing in the transmit resonant circuit.

In certain embodiments, the transmit circuitry is configured to maintain the drive signal for a period of time.

In certain embodiments, the drive signal is applied and removed by ramping an effective level of the drive signal up and down.

In certain embodiments, the transmit circuitry includes a processor that utilizes pulse-width modulation to control the ramping up and down of the effective level of the drive signal.

In certain embodiments, the transmit circuitry is configured to provide charging for a period of time if an increased load on the transmit coil is detected.

In certain embodiments, the switch allows power to be communicated to the storage cell only when the alternating magnetic field in the vicinity of the receive coil is of sufficient strength to result in an induced receive coil current greater than a minimum value when the switch is closed.

In certain embodiments, the minimum value is at least about 50 mA, taken as a full-wave rectified average current.

In certain embodiments, the inductively coupled current induced in the receive coil is less than a maximum value when the switch is open.

In certain embodiments, the maximum value is less than about 100 uA, taken as a full-wave rectified average current.

In certain embodiments, the switch only allows power to be communicated to the storage cell when a measured characteristic of the storage cell indicates that charging is needed.

In certain embodiments, once closed, the switch remains closed until the magnetic field is substantially removed.

Certain embodiments provide a system for maintaining a drive signal to a resonant circuit at a resonant frequency comprising: an oscillator configured to provide an output to a phase comparator and a drive circuit, the drive circuit configured to provide a drive signal to a resonant circuit; a phase detector configured to receive a filtered version of the drive signal from the resonant circuit and provide a phase-indicating signal to the phase comparator; and the phase comparator, wherein the phase comparator is configured to provide a signal based on the phase difference between the oscillator output and the phase-indicating signal, wherein the signal from the phase comparator is used to control the frequency of the oscillator such that the phase difference converges to a fixed value.

Certain embodiments provide a method for maintaining a drive signal to a resonant circuit at a resonant frequency comprising: using an oscillator to provide an output to a phase comparator and a drive circuit, the drive circuit configured to provide a drive signal to a resonant circuit; using a phase detector to receive a filtered version of the drive signal from the resonant circuit and provide a phase-indicating signal to the phase comparator; using the phase comparator to provide a signal based on the phase difference between the oscillator output and the phase-indicating signal; and using the signal from the phase comparator to control the frequency of the oscillator such that the phase difference converges to a fixed value.

In certain embodiments, the resonant circuit comprises at least one of a second order low-pass filter and a second order high-pass filter, and wherein the fixed value is about 90 degrees, thereby maintaining the drive signal to the resonant circuit at about the resonant frequency.

In certain embodiments, the system further includes an integrator configured to vary a control signal supplied to the oscillator based on the signal provided by the phase comparator, thereby adjusting the oscillator such that there is about a ninety degree phase shift between the oscillator output and the resonant circuit output, thereby maintaining the drive signal to the resonant circuit at about the resonant frequency.

In certain embodiments, the method further includes using an integrator to vary a control signal supplied to the oscillator based on the signal provided by the phase comparator, thereby adjusting the oscillator such that there is about a ninety degree phase shift between the oscillator output and the resonant circuit output, thereby maintaining the drive signal to the resonant circuit at about the resonant frequency.

In certain embodiments, the integrator has an input-to-output transfer function of a first order integrator.

In certain embodiments, the integrator has an input-to-output transfer function of a first order low-pass filter.

In certain embodiments, the resonant circuit comprises at least one capacitor effectively in series with an inductor.

In certain embodiments, the resonant frequency is in the range of about 15 kHz to 100 kHz.

In certain embodiments, the resonant frequency is about 23 kHz.

In certain embodiments, the resonant frequency is greater than 100 kHz.

Certain embodiments provide a system for maintaining a drive signal to a resonant circuit at a resonant frequency comprising: an oscillator configured to provide an output to a phase comparator, a drive circuit having variable gain, and a low-pass filter, the drive circuit configured to provide a drive signal to a resonant circuit, the low-pass filter having a characteristic frequency that is about the same as the resonant frequency of the resonant circuit; a phase detector configured to receive a filtered signal from each of the low-pass filter and the resonant circuit, and responsively provide a phase-indicating signal to the phase comparator representing the phase of whichever of the phase detector inputs is stronger; and the phase comparator, wherein the phase comparator is configured to provide a signal based on the phase difference between the oscillator output and the phase-indicating signal, wherein the signal from the phase comparator is used to control the frequency of the oscillator such that the phase difference converges to about a ninety degree phase shift between the oscillator output and the phase-indicating signal, thereby maintaining the drive signal to the resonant circuit at about the resonant frequency.

In certain embodiments, the system further includes an integrator configured to vary a control signal supplied to the oscillator based on the signal provided by the phase comparator, thereby adjusting the oscillator such that there is about a ninety degree phase shift between the oscillator output and the phase-indicating signal and maintaining the drive signal to the resonant circuit at about the resonant frequency.

Certain embodiments provide a method for maintaining a drive signal to a resonant circuit at a resonant frequency comprising: using an oscillator to provide an output to a phase comparator, a drive circuit having variable gain, and a low-pass filter, the drive circuit configured to provide a drive signal to a resonant circuit, the low-pass filter having a characteristic frequency that is about the same as the resonant frequency of the resonant circuit; using a phase detector to receive a filtered signal from each of the low-pass filter and the resonant circuit, and responsively provide a phase-indicating signal to the phase comparator representing the phase of whichever of the phase detector inputs is stronger; using the phase comparator to provide a signal based on the phase difference between the oscillator output and the phase-indicating signal; and using the signal from the phase comparator to control the frequency of the oscillator such that the phase difference converges to about a ninety degree phase shift between the oscillator output and the phase-indicating signal, thereby maintaining the drive signal to the resonant circuit at about the resonant frequency.

In certain embodiments, the method further includes using an integrator to vary a control signal supplied to the controlled oscillator based on the signal provided by the phase comparator, thereby adjusting the oscillator output such that there is about a ninety degree phase shift between the oscillator output and the phase-indicating signal and maintaining the drive signal to the resonant circuit at about the resonant frequency.

In certain embodiments, the integrator has an input-to-output transfer function of a first order integrator.

In certain embodiments, the integrator has an input-to-output transfer function of a first order low-pass filter.

In certain embodiments, the resonant circuit comprises at least one capacitor in series with an inductor.

In certain embodiments, the resonant frequency is in the range of about 15 kHz to 100 kHz.

In certain embodiments, the resonant frequency is about 23 kHz.

In certain embodiments, the resonant frequency is greater than 100 kHz.

Certain embodiments provide a rechargeable battery assembly comprising: a storage cell; and receive circuitry comprising a receive coil operatively connected to receive control circuitry, wherein the receive coil is configured to receive inductively coupled current, wherein the receive control circuitry is configured to rectify the current and communicate charging power to the storage cell, wherein the coil is wound around a shield/core comprising magnetically permeable material, and wherein the shield/core is disposed around the storage cell.

Certain embodiments provide a method of constructing a rechargeable battery assembly comprising: disposing a shield/core comprising magnetically permeable material around a storage cell; winding a receive coil around the shield/core; and providing the receive coil in operative connection with receive control circuitry and the storage cell, wherein the receive coil is configured to receive inductively coupled current, and wherein the receive control circuitry is configured to rectify the current and communicate charging power to the storage cell.

In certain embodiments, the assembly further includes an electrically insulating layer disposed between the shield/core and the storage cell.

In certain embodiments, the assembly further includes an electrically insulating layer disposed between the shield/core and the receive coil.

In certain embodiments, the shield/core comprises metal.

In certain embodiments, the shield/core comprises a cobalt-based alloy comprising a cobalt content greater than 50%.

In certain embodiments, the assembly comprises a first end and a second end, and wherein the shield/core extends at least about 90% of the distance between the first end and the second end.

In certain embodiments, the assembly comprises a first end and a second end, and wherein the shield/core extends to within less than about 2.5 mm of each end of the assembly.

In certain embodiments, the assembly comprises a first end and a second end, wherein the shield/core comprises a gap that runs between the first end and the second end, and wherein the receive coil includes a return wire disposed in the gap such that a first coil end and a second coil end can terminate at the same end of the assembly.

In certain embodiments, the assembly comprises the outer dimensions of a standard AA cell.

In certain embodiments, the assembly comprises the outer dimensions of a standard cell, and wherein the storage cell has a volume of at least about 60% that of a storage volume of the standard cell.

In certain embodiments, the storage cell comprises a nickel metal hydride cell.

In certain embodiments, the storage cell comprises a plurality of cells.

In certain embodiments, the receive coil comprises about 50-200 turns.

In certain embodiments, the receive coil comprises a thickness of about 0.4 mm.

In certain embodiments, the receive coil comprises flat wire.

In certain embodiments, the receive circuitry includes a receive resonant circuit that exhibits resonance at about a resonant frequency that a transmit resonant circuit exhibits resonance, wherein the transmit resonant circuit is associated with transmit circuitry and a transmit coil configured to produce an alternating magnetic field at about the resonant frequency.

In certain embodiments, the receive resonant circuit exhibits a Q value of at least about 10 at the resonant frequency.

In certain embodiments, the receive resonant circuit exhibits a Q value of at least about 15 at the resonant frequency.

BRIEF DESCRIPTION OF THE DRAWING(S)

Figure 1:
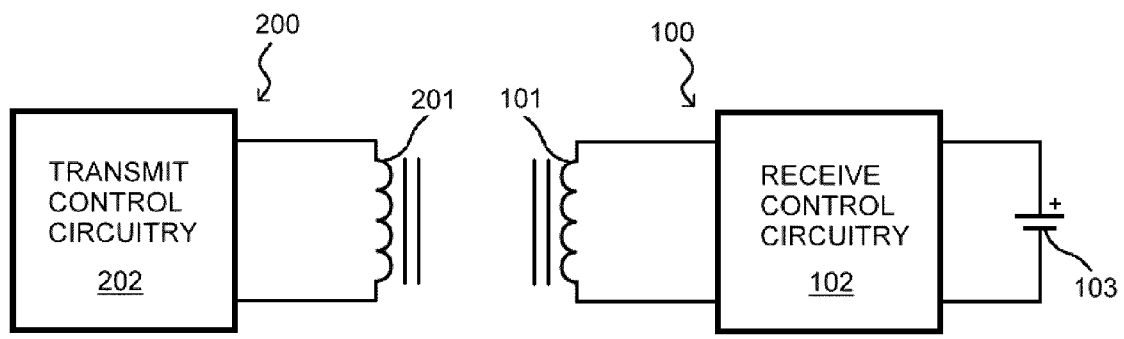
FIG. 1 is a diagram of an inductive battery charging system used in accordance with embodiments of the present technology.

The foregoing summary, as well as the following detailed description of embodiments of the present invention, will be better understood when read in conjunction with the appended drawings. For the purpose of illustrating the invention, certain embodiments are shown in the drawings. It should be understood, however, that the present invention is not limited to the arrangements and instrumentality shown in the attached drawings.

DETAILED DESCRIPTION OF PREFERRED EMBODIMENT(S)

Embodiments of the present technology relate to systems and methods for inductively charging batteries. While certain embodiments are described in detail, the present inventions are not limited to such embodiments, rather, one skilled in the art will understand that the teachings herein are applicable to many types of battery powered devices that can benefit from the inductive charging systems and methods disclosed herein.

Referring to FIG. 1, a basic magnetically coupled battery charging system comprises transmit circuitry 200 and rechargeable battery assembly 100. Transmit circuitry 200 includes transmit (primary) coil 201 driven by transmit control circuitry 202, which produces an alternating current in coil 201. A portion of the magnetic field responsively generated by transmit coil 201 couples to receive (secondary) coil 101. The induced current in coil 101 passes through receive control circuitry 102 on the way to storage cell 103. Together, receive coil 101 and receive control circuitry 102 comprise the receive circuitry. In certain embodiments, storage cell 103 comprises a single nickel metal hydride (NiMH) cell. In other embodiments, a storage cell can comprise numerous cells and/or different battery chemistry.

Figure 2:
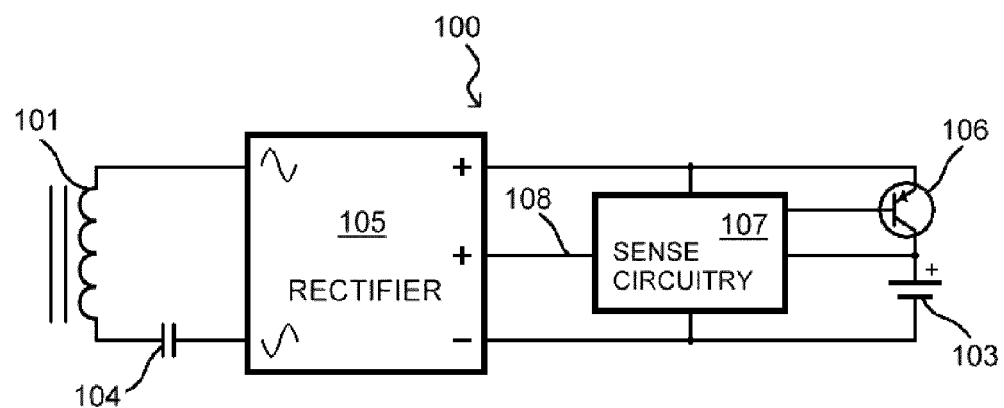
FIG. 2 is a diagram of a rechargeable battery assembly used in accordance with embodiments of the present technology.

The circuitry of rechargeable battery assembly 100 is shown in more detail in FIG. 2. In this embodiment, receive resonating capacitor 104, of value 100 nF, is placed in series with receive coil 101, of value 480 uH. The series resonance frequency of the combination is 23 kHz, which closely matches the frequency of the magnetic field applied by transmit circuitry 200. The series resonance substantially reduces the voltage drop that would otherwise be present through the series impedance of the receive coil 101, thereby increasing the sensitivity and the coupling efficiency of the battery assembly 100 to transmit circuitry 200. To increase the benefit, capacitor 104 can maintain a capacitance tolerance of 5% or better and exhibit a low dielectric loss. In certain embodiments, the capacitor 104 can include a dielectric comprising polyphenylene sulphide (PPS), such as Panasonic part number ECHU1H104GC9 of standard size 1913, for example.

In certain embodiments, transmit circuitry 200 can utilize an operating frequency between about 15 kHz and about 100 kHz. A frequency above the audible range can be desirable to avoid incidental audible emissions. Also, an increased operating frequency can require smaller magnetic components, such as the magnetic cores of the primary and secondary coils, and their associated resonating capacitors. However, an excessively high operating frequency can result in increased primary and secondary core losses. Increased primary core losses can increase the drive power required to create a magnetic field of desired strength. Increased secondary core losses can reduce the portion of the coupled power available to charge the storage cell. While an operating frequency between about 15 kHz and about 100 kHz is appropriate for the described embodiments, it may be desirable to use other frequency ranges in other situations. For example, it may be beneficial to use an operating frequency above about 100 kHz in connection with small rechargeable battery assemblies that include small receive coil structures, such as those that may be employed in connection with hearing aids, for example.

The output of the series resonant circuit formed by 101 and 104 is rectified by full-wave bridge rectifier 105 and applied to storage cell 103 through series switch transistor 106. To decrease circuit losses, rectifier 105 can be constructed from a relatively large chip area Schottky rectifier, such as an nxp type PMEG3002AEL, for example, and switch transistor 106 can comprise a relatively large chip area transistor, such as a Zetex type FMMT591A, for example. Switch transistor 106 is controlled by sense circuitry 107, which is sensitive to the cell state of charge. Bridge rectifier 105 includes an additional pair of Schottky diodes to provide a second positive output 108. Due to the relatively low current loading of the diodes when compared to the main charging rectifiers, the diodes provide a higher supply voltage on output 108 to sense circuitry 107 than would be available from the main bridge rectifier outputs.

In this embodiment, the cell state of charge can be determined by measuring the cell voltage, which method is appropriate for a single NiMH cell subject to moderate charge rates. For example, a cell with an unloaded voltage greater than 1.37 volts can be considered fully charged, while a voltage of less than 1.37 volts can indicate the ability to accept more charge. This threshold voltage may be temperature compensated or otherwise adjusted, depending on the exact cell chemistry. Other methods for determining cell state of charge are known in the art and can be utilized.

If full storage cell charge is determined (for example, by sensing an unloaded cell voltage of greater than 1.37 volts), sense circuitry 107 will not turn on switch transistor 106, thereby preventing current flow to the cell and the corresponding current flow through coil 101. Sense circuitry 107 is designed to operate with low current drain and by itself does not cause significant current flow in coil 101. As will be discussed in connection with the overall system operation, sensing of cell voltage can occur during an initiation of the applied magnetic field. If the storage cell is determined to be capable of accepting additional charge at this time (for example, by sensing an unloaded cell voltage less than 1.37 volts), sense circuitry 107 can turn on switch transistor 106, enabling charging of the cell with its associated current flow through the receive coil. The switching action of this embodiment then latches on with a hysteresis of, for example, 0.3 volts relative to the threshold voltage, such that the switch will not turn off until the cell voltage exceeds 1.67 volts. It has been found that this degree of hysteresis is sufficient to overcome a normal rise in cell voltage that may accompany the application of charging current. By this action, in the absence of a cell fault, the cell will continue charging until the magnetic field is removed.

This cell charge-state sensing and resultant charge-current switching could be allowed to occur as soon as the coupled magnetic field reaches a strength that would cause at least some charge current to flow if switch transistor 106 were switched on. On the other hand, battery sense circuitry 107 can be configured such that the magnetic field reaches a defined strength (for example, beyond a minimum that would cause charge current to flow if switch transistor 106 were switched on) before allowing charge current to flow. In such instances, when the switch-on of charging does occur, a sudden and significant increase in current flow through receive coil 101 results and provides a corresponding sudden and significant increase in loading on transmit coil 201. As will be discussed, this sudden increase in loading can be sensed by the transmit circuitry even if the magnetic coupling is not strong. This sensing is aided by the low inherent losses and resultant high unloaded Q that will be suggested for the resonant transmit coil circuit.

This sensing action can allow the rechargeable battery assembly to effectively signal to the transmit control circuitry that it needs charging without requiring auxiliary data paths or continuous data transmission. Sensing a battery that needs charging, transmit circuitry 200 can then maintain the charging magnetic field for a set period of time before removing the field and thus allowing the receive control circuitry to unlatch. The transmit circuitry can then ramp the applied magnetic field up again to see if the cell can accept more charging. In such embodiments, placing extraneous magnetic materials into the vicinity of transmit coil 201 does not result in the sudden and significant increase in loading that would trigger the transmit control circuit to maintain the magnetic field.

Figure 3:
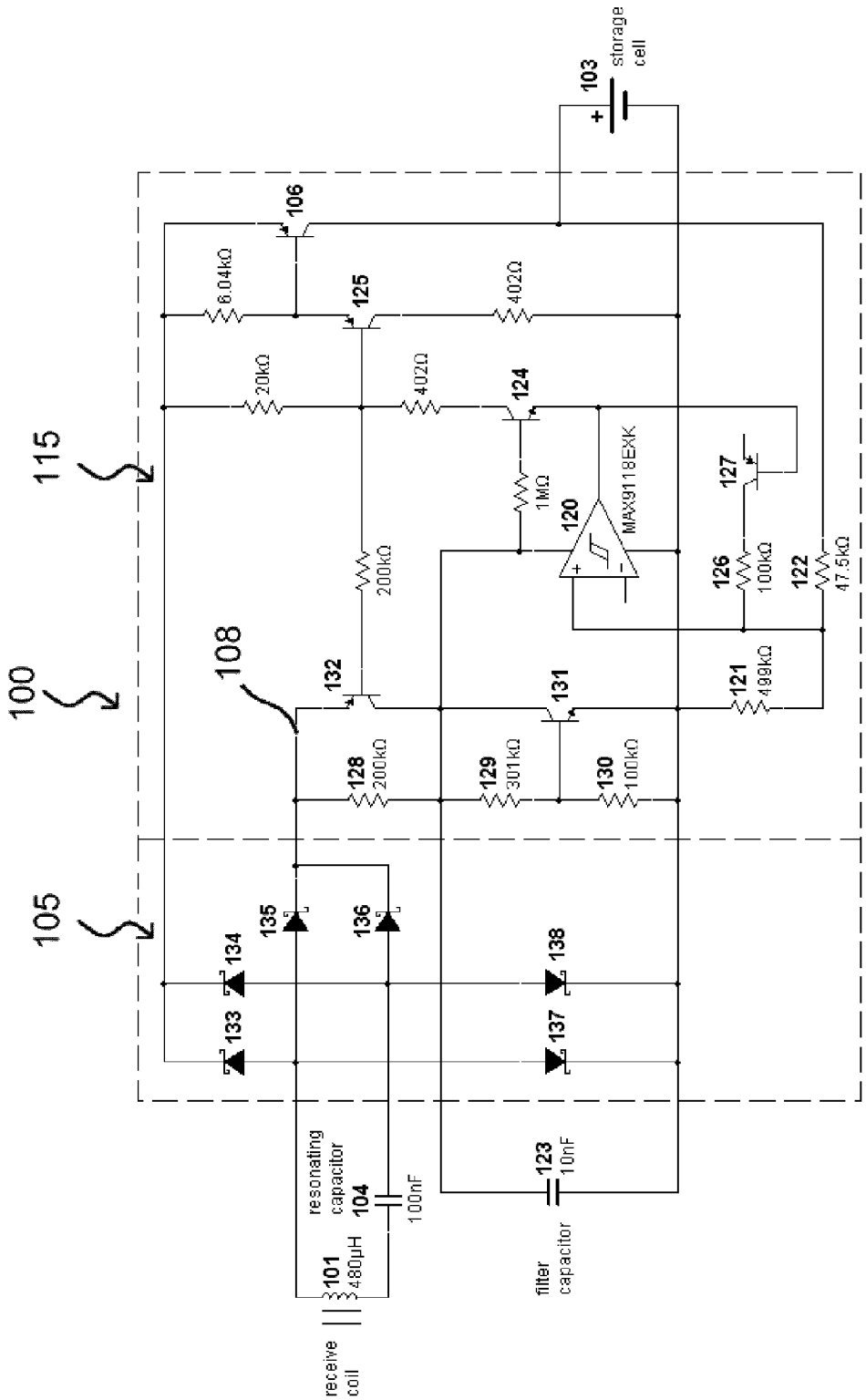
FIG. 3 is a schematic diagram of a rechargeable battery assembly used in accordance with embodiments of the present technology.

FIG. 3 is a schematic diagram of a rechargeable battery assembly 100. Comparator 120 compares the voltage across storage cell 103, scaled by the voltage divider created by resistors 121 and 122, against its internal 1.252 volt precision reference. In certain embodiments, comparator 120 can comprise a Maxim type MAX9117, for example. In certain embodiments, when the comparator's supply voltage across filter capacitor 123 has risen above about 1.5 volts, the comparator can become operational. If the cell voltage is less than the 1.37 volt threshold voltage, indicating a battery capable of accepting additional charge, the comparator output is then pulled low, turning on switch transistor 106 through transistors 124 and 125. Transistors 124 and 125 and their associated resistors act together to provide an appropriate drive current to switch transistor 106. Comparator hysteresis is provided through resistor 126 and diode-connected transistor 127. The supply voltage divider created by resistors 128, 129, and 130 establishes that an additional 0.75 volts is required at second positive output 108 above the 1.5 volts required across filter capacitor 123 for comparator 120 to become operational. 2.4 volts peak or 1.7 volts rms is required from the unloaded output of receive coil 101 to produce this voltage. This relationship establishes the minimum magnetic field sensitivity threshold of the rechargeable battery assembly, in the described embodiment. This threshold ensures that the field is sufficiently strong to enable significant battery charging current, resultant receive coil current flow of typically at least 50 mA full-wave rectified average current, for example, and resultant transmit coil loading. Additionally or alternatively, filter capacitor 123 could be made larger, on the order of 1 uF, to cause a delay in cell sensing and resultant switching action, to further aid in battery sensing by the transmit control circuitry. If the receive control circuitry determines that the storage cell is full, switch transistor 106 remains off and the receive coil current flow remains below, for example, 100 uA full-wave rectified average current at the applied field strengths present during the sensing portion of system operation.

Transistor 131, in conjunction with resistors 129 and 130, acts as a voltage clamp to ensure that excessive supply voltage cannot be applied across comparator 120 at times when the applied magnetic field may be large, but switch transistor 106 remains open. Transistor 132 switches on with transistors 124, 125, and 106 to bypass resistor 128 and provide a high supply voltage to comparator 120 when the receive coil resonating circuit is loaded by the charging storage cell. The junction voltage drops of transistors 124, 125, and 106 ensure, in conjunction with other discussed circuit characteristics, that the receive coil resonating circuit is not loaded down so far that insufficient voltage is available to maintain the operation of comparator 120, even when the voltage across storage cell 103 may be low due to a condition of increased cell charge depletion.

The described embodiment of the rechargeable battery assembly circuitry is described in terms of generally available components comprising discrete surface mount parts, with the exception of integrated circuit comparator 120. Nonetheless, the functionality within the dotted lines of FIG. 3 can be incorporated in a special-purpose integrated circuit to reduce cost and size. Rectifier 105, comprising diodes 133-138, can be removed to a second integrated circuit, separated from the charge on/off control circuitry 115 comprising sense circuitry 107 and switch transistor 106, depending on circuit fabrication optimization concerns. In certain embodiments, rectifier 105 can be replaced by a synchronous MOSFET-based rectifier, such as that described in U.S. Pat. No. 5,623,550 issued to Killion, which patent is incorporated herein by reference in its entirety.

A rechargeable battery assembly constructed according to FIGS. 1, 2, and 3 could take many forms. Receive coil 101 and receive control circuitry 102 could be included as an integral part of a battery-operated device, also including a removable or non-removable storage cell or cells. Constructing the complete assembly in the form of an industry standard cell size, though, enables its use as a direct replacement for standard cells.

Figure 4:
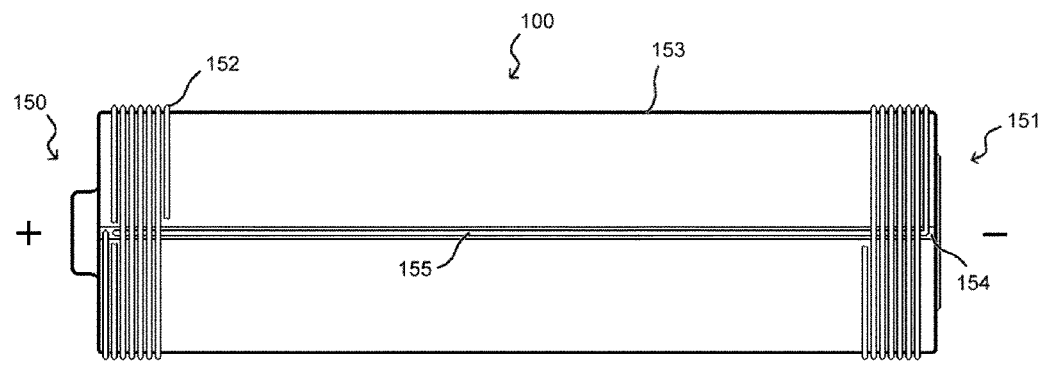
FIG. 4 is a side view of a rechargeable battery assembly used in accordance with embodiments of the present technology.

A preferred construction for rechargeable battery assembly 100 is shown in side view in FIG. 4, with an assumed protective overwrap removed. The described embodiment has the overall form factor and outer dimensions of a standard AA cell. The positive end of the assembly is at 150 and the negative end at 151. The receive coil winding 152 of receive coil 101 is wound on the outside of shield/core 153 and comprises about 105 turns of #26 AWG enameled copper wire wound in a single layer running the full or almost the full length of the rechargeable battery assembly and determining its outer dimensions. FIG. 4 omits the portion of the coil winding between the two ends in order to show other aspects of the rechargeable battery assembly 100. Optionally, a smaller wire gauge may be used, at the expense of higher winding resistance and resultant losses. Alternatively, rectangular or flat wire may be used to improve the winding packing factor and give a smoother outer surface to the winding. The number of turns selected for the coil determines the open circuit voltages developed by the coil over the range of expected magnetic field strengths. Employing a higher number of turns can provide sufficient voltage to meet the minimum sensing requirement (1.7 Vrms, as discussed in connection with FIG. 3) with the weaker fields found at greater distances from the primary coil and provide greater charging currents with those weaker fields. However, at close distances, a higher impedance would then be reflected to the transmit coil, reducing charging current draw and increasing the transmit coil voltage drive that may be utilized. Likewise, employing a lower number of turns could allow greater charging current at close distances with lower transmit coil drive voltages, but may inhibit the development of sufficient receive coil voltage to allow effective charging at greater distances. For a coil of the described dimensions, excited at about 23 kHz, charging a single NiMH storage cell through the voltage drop of the Schottky diode bridge rectifier 105 and switch transistor 106 of FIG. 2, turn numbers from about 50 to about 200 could be utilized, depending on the desired tradeoffs. For similar charging power vs. distance tradeoffs with different total storage cell plus rectifier plus switch transistor voltage drops, the number of receiving coil turns can vary in direct proportion to the change in the total voltage drop. For example, if the storage cell voltage were 3.5 volts under charge and the rectifier bridge plus switch transistor voltage drop 0.5 volts, for a total of 4.0 volts, this would be twice the 1.4 volt charging voltage of the assumed NiMH storage cell of the preferred embodiment, plus the ~0.6 volt bridge rectifier plus switch transistor drop. 100 to 400 turns would then give similar charging power vs. distance relationships, assuming similar coil geometry and operating frequency. For different operating frequencies, the number of turns should vary roughly inversely with the frequency, so as to maintain the same open circuit voltage relationship to magnetic field strength. In other words, this charging power vs. distance relationship can be maintained for a rechargeable battery assembly of the described size and form factor when the number of receive coil turns is equal to about 25 to 100 times the charging voltage of the storage cell(s) plus the voltage drop through the rectifier bridge, divided by the ratio frequency change from about 23 kHz.

Shield/core 153 is a generally cylindrical shell of magnetically permeable material. Within the shell and separated by an electrically insulating layer is storage cell 103. The shield/core can serve two functions. It can serve as a magnetic core material for receive coil 101 to concentrate the magnetic flux and increase the magnetic coupling to the transmit coil 201. A second function is to shield the materials of the storage cell from the applied magnetic field. Conventional battery construction includes magnetic materials such as a steel case that exhibit high hysteresis and eddy current losses when exposed to alternating magnetic fields, especially at higher frequency. Allowing exposure of the cell materials to the magnetic field can shunt away and dissipate the magnetic charging energy, reducing the magnetic coupling capability and efficiency. In certain embodiments, shield/core 153 can extend past the storage cell components by at least about 1 or 2 mm, but the additional losses can be held to an adequately low value if the shield/core extends to within about 1 mm, or at most about 2.5 mm from the end of the cell components for the AA-sized rechargeable battery assembly, representing a distance of not more than about 2-5% of the overall assembly length. Thus, shield/core 153 can extend at least about 90% of the length of the battery assembly.

In certain embodiments, the shield/core can comprise a material that exhibits high permeability, high saturation flux density, and low losses at the operating frequency, such as Metglas 2714A, for example, which is a cobalt-based alloy. In a rechargeable battery assembly with a core thickness of 0.152 mm, saturation flux density of 0.57 Tesla can allow an average cell charge current of 450 mA before core saturation. In comparison to isotropic annealing, annealing in the long dimension of the battery assembly can result in an increase in permeability and saturation flux density, along with a small reduction in core losses, which can be desirable results. Other core thicknesses may be employed, yielding different saturation-limited charging currents, and with few other changes to assembly behavior.

While exhibiting desirable magnetic properties, materials such as Metglas 2714A, for example, also have relatively high electrical conductivities. When a continuous cylinder is employed as a core, a shorted turn is formed, resulting in induced current flow in the core and increased core losses. These losses can be reduced if the core is constructed with, for example, a multiple-layer spiral wrap of the core material, with the layers separated by an electrical insulator. However, the electrical insulator undesirably adds thickness to the core. It has been found that an alternative solution is to create a longitudinal gap 154 in the core, as shown in FIG. 4. This has the additional advantage that the gap can help to form a channel wherein return wire 155 of receive coil winding 152 can be positioned without exceeding the desired outer dimensions of the cylindrical battery assembly. It is preferred that wires from both ends of the coil terminate at the same end of the battery assembly where the assembly circuitry is located. For a single layer receiving coil, a return wire is utilized that otherwise would not fit well in the cylindrical assembly. The 0.4 mm diameter of the #26 gauge receiving coil wire is thicker than the 0.152 mm core, but the available channel depth could be increased if the electrical insulating layer between the shield/core and the internal cell and an optional layer between the shield/core and the coil were also gapped. Additionally, return wire 155 can be made thinner, either by a change of gauge or by flattening Thinner coil wire overall could also be employed, which would increase the DC coil resistance, but some increase would be acceptable.

The receiving coil as described has a DC resistance of 0.6 Ohms. At the 23 kHz circuit series resonant frequency, the gapped core losses may be modeled as a 2.9 Ohm series resistor. With a low-loss capacitor such as that specified, resonant capacitor 104 losses can be negligible. The resultant net unloaded resonant circuit Q of about 20 may be found by dividing the characteristic impedance of the circuit (the 69 Ohm value of the reactive impedances of the 480 uH transmit coil and 100 nF capacitor at the resonant frequency) by the total equivalent series losses of about 3.5 Ohms. The Q also represents the value of the bandwidth of the range of frequencies around resonance where the current flow through the series resonant circuit is at least 70.7% of the maximum at resonance when driven by a uniform amplitude voltage source, divided by the resonant frequency. When the resonant circuit is driven as a low pass filter by a voltage source at its resonant frequency, the Q may also be found as the ratio of the voltage at the output of the low pass filter divided by the voltage at the input. While a resonant circuit Q of, for example, 10 would still be workable, the higher associated losses would reduce the available charge current.

Figure 5:
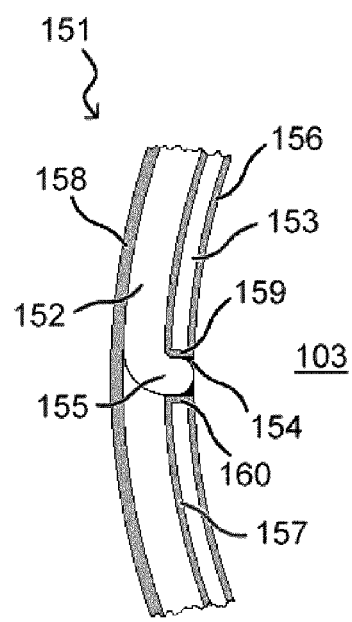
FIG. 5 is an end view of a portion of the negative end of the rechargeable battery assembly of FIG. 4.

FIG. 5 shows a segment of an end view of the outer region of the negative end of the battery assembly including longitudinal gap 154. Also shown are shield/core 153, receive coil winding 152, return wire 155, inner electrically insulating layer 156, optional outer electrically insulating layer 157, protective outer wrap 158, and an inner region reserved for storage cell 103. Insulating layers 156 and 157 may be joined by insulating segments 159 and 160, thus forming a single continuous insulating sheet. Given a wire diameter of 0.4 mm, shield/core thickness of 0.152 mm, and roughly 0.1 mm for each of the insulating layers and the protective wrap, 1.7 mm of the available 14 mm outside diameter assembly dimension is used for the coil-related elements, leaving a 12.3 mm diameter for the storage cell, resulting in an available battery cell cross-sectional area halfway between those of conventional AA (14 mm diameter) and AAA cells (10 mm diameter).

Figure 6:
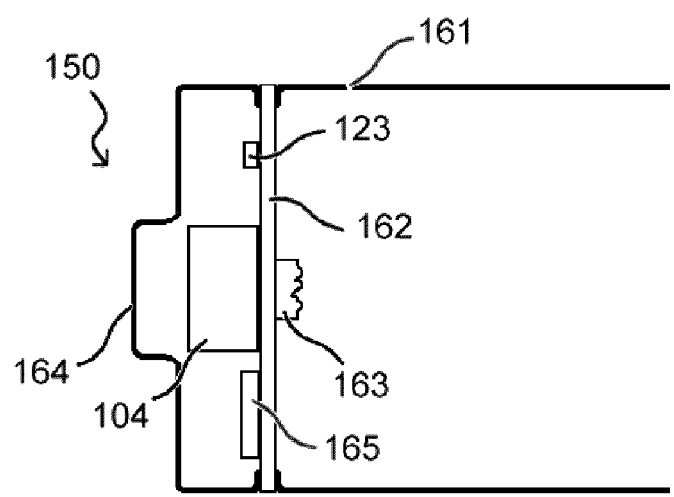
FIG. 6 is a side sectional view of a portion of the positive end of the rechargeable battery assembly of FIG. 4.

A possible placement of receive control circuitry 102 is shown in FIG. 6, which is a cutaway side view of the positive end 150 of rechargeable battery assembly 100. Not shown are shield/core 153, receive coil winding 152, inner and outer electrically insulating layers 156 and 157, respectively, and protective outer wrap 158. Storage cell casing 161 also serves as the negative storage cell and battery assembly connection. The casing is in electrical contact with battery circuitry substrate 162. Storage cell positive terminal 163 also makes electrical contact with substrate 162. Substrate 162 may be vented to provide atmospheric connection from a vent hole in assembly positive terminal 164 through to a vent in storage cell 103. The storage cell can be of substantially conventional construction, or may be modified to a lesser or greater extent for adaptation to the configuration of the rechargeable battery assembly. Substrate 162 serves as a connection point for the ends of receive coil winding 152 and return wire 155. It also serves as a mount for receive control circuitry 102, including resonating capacitor 104, filter capacitor 123, and receive control circuitry integrated circuit 165, comprising circuitry portions 105 and 115 of FIG. 3. Resonating capacitor 104 can be of conventional construction, as described above, or may be of special shape, optimized to the available dimensions. Measured from the outer surface of battery assembly positive terminal 164 to the inner surface of substrate 162, 4 to 5 mm of assembly length are used by the receive control circuitry and related parts. Assuming overall battery assembly dimensions matching a conventional AA cell, this leaves a length for storage cell 103 of about 45 to 46 mm, intermediate between the lengths of conventional AA (50 mm) and AAA (44 mm) batteries. The resultant overall volume available for the storage cell of about 5,400 mm$^2$ is about 70% of the total volume of the AA-sized assembly of 7,700 mm$^2$. Some construction variations could reduce this to, for example, 60%, but an appreciable amount of the standard cell's storage ability can be maintained.

Figure 7A:
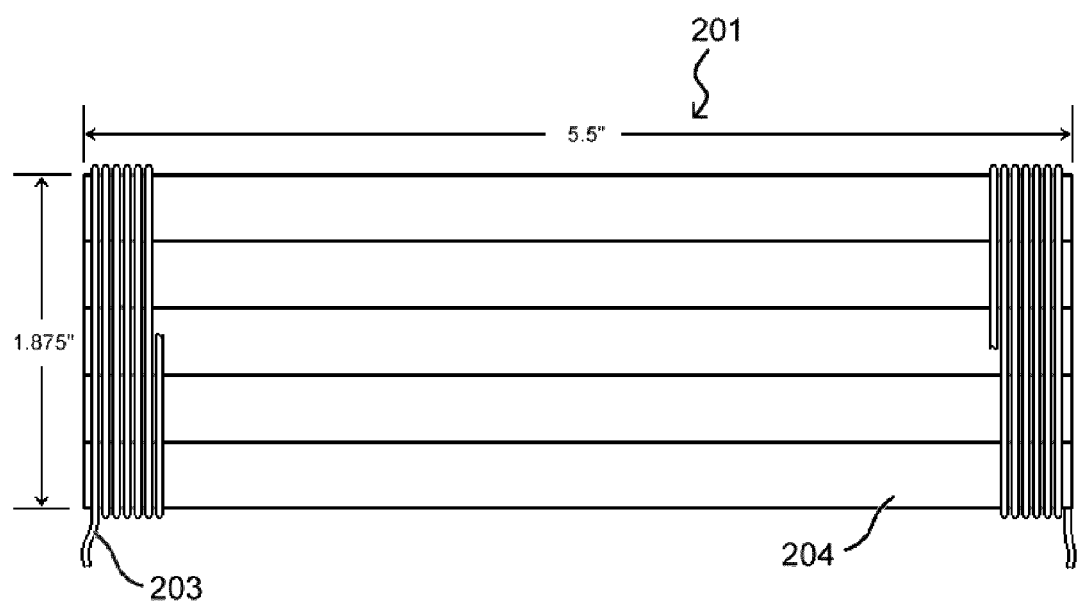
FIG. 7A is a top view of a transmit coil used in accordance with embodiments of the present technology.
Figure 7B:
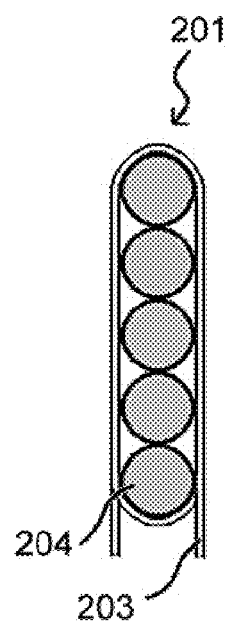
FIG. 7B is a side view of the transmit coil of FIG. 7A.

Turning now to a further description of an embodiment of transmit circuitry 200 of FIG. 1, FIG. 7A shows a top view of an embodiment of transmit coil 201, and FIG. 7B shows a side view of the same. FIG. 7A omits the portion of the coil winding 203 between the two ends in order to show other aspects of the transmit coil 201. In certain embodiments, transmit coil winding 203 of transmit coil 201 can comprise 125 turns of #22 copper wire wound in a single layer around a ferrite core. The use of multi-strand litz wire can result in a small reduction in effective coil resistance at the operating frequency, and can be used in certain embodiments. The core can comprise a slab of low loss, low frequency ferrite with dimensions of about 5.5 inches by 1⅞ inches with the winding occupying nearly the full length. For prototyping convenience, a core can be constructed of five cylindrical ferrite rods 204 of ⅜ inch diameter, for example, Amidon type R33-037-550, yielding an inductance of 1.6 mH. The coil resistance is then 0.6 Ohms and the core losses at 23 kHz can be represented by a series resistance of 1.4 to 2.2 Ohms, depending on drive level. In operation, the core magnetic flux density does not exceed about 10% of the saturation flux density of 0.25 Tesla. A thinner core can be used, but may result increased core loss.

Figure 8:
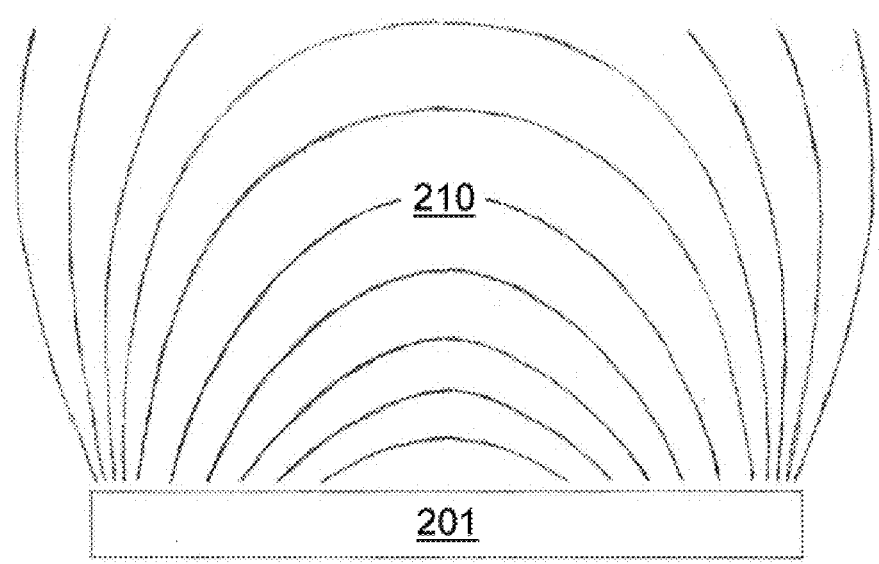
FIG. 8 is a plot of the induced magnetic field lines over the longitudinal center line of the transmit coil of FIG. 7A.
Figure 9:
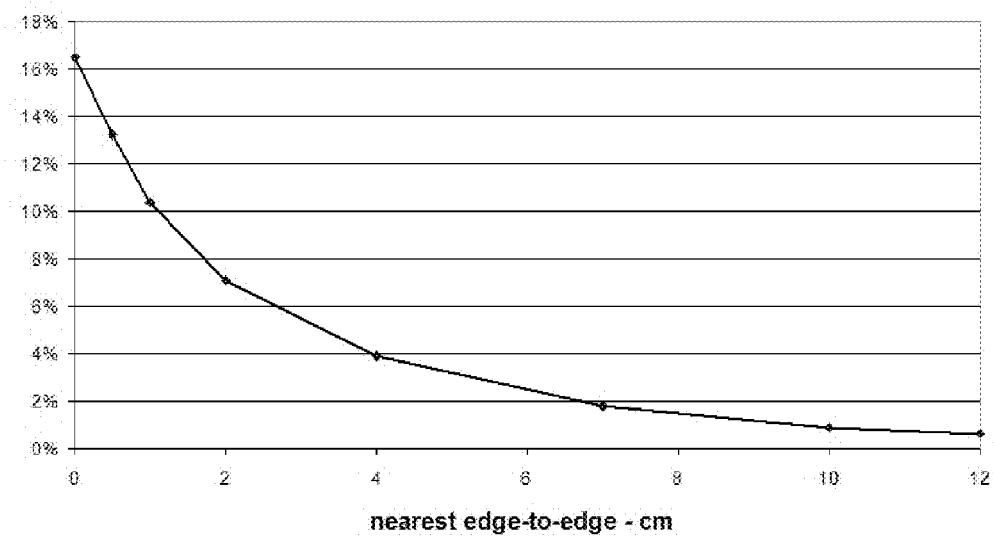
FIG. 9 is a graph depicting the percentage of transmit receive coil magnetic flux coupling vs. separation distance when the rechargeable battery assembly of FIG. 4 is aligned over the longitudinal center line of the transmit coil of FIG. 7A.

FIG. 8 illustrates the induced magnetic flux lines 210 above the longitudinal center line of the transmit coil construction of FIG. 7A when laid flat. The flux lines are generally parallel to the long dimension of the core over the central region of core's length. The presence of a receive coil with a flux-concentrating core can affect the illustrated flux lines, generally in the direction of aligning a greater portion of the flux along the receive coil axis. A rechargeable battery assembly can be coupled strongly to the transmit coil when they are close together and the receive coil axis is aligned with the transmit coil's induced field. The graph of FIG. 9 shows the percentage of magnetic flux that can be coupled when the receive coil of FIG. 4 is aligned over the center of the transmit coil of FIG. 7 as described above.

When the transmit coil and the receiving coil are touching, about 16% of the magnetic flux generated by the transmitting coil can be coupled to the receiving coil. This is in contrast to nearly 100% in a conventional transformer. However, this degree of reduced coupling (and lower coupling) is not a deterrent to effective charging according to embodiments of the technology described herein. If the separation between the transmit coil and the receiving coil is increased to about 7 cm, for example, the coupled flux is reduced to less than about 2%. However, this degree of reduced coupling is still not a deterrent to effective charging according to the embodiments of the technology presented herein. Similarly, effective charging capability is maintained according to the embodiments of the technology presented herein despite reduced coupling that can arise from misalignment between the applied field and the receiving coil orientation (excluding misalignments near orthogonal). The effectiveness of the embodiments of the technology presented herein is due in part to the low-loss, high-Q characteristic of the transmit coil, which when used in combination with a resonating capacitor, can generate a large uncoupled magnetic field with little wasted drive power when driven at the resonant frequency.

Figure 10:
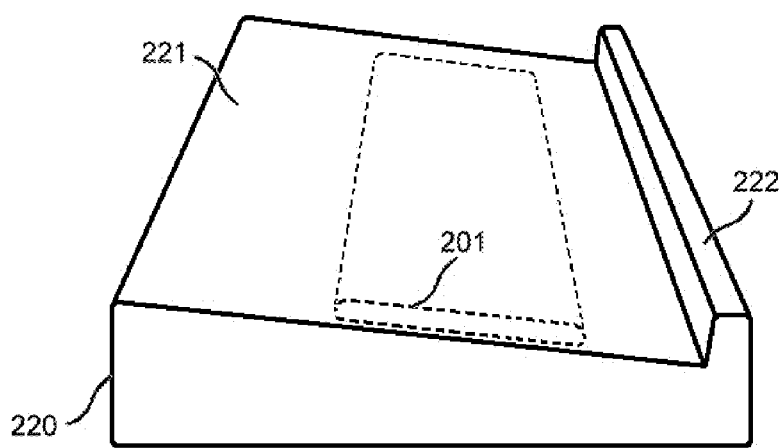
FIG. 10 is a perspective view of a housing for a transmit coil and transmit control circuitry used in accordance with embodiments of the present technology.

FIG. 10 is a perspective view of a housing 220 for transmit coil 201 and transmit control circuitry 202 (shown, for example, in FIG. 1). Coil 201 is mounted below upper surface 221, which is advantageously slightly slanted from the horizontal between about 10 and about 45 degrees. End-stop surface 222 is positioned about 1 to about 3 cm from the lower edge of coil 201. In use, a device powered by one or more rechargeable battery assemblies is placed on surface 221, resting against end-stop surface 222, and oriented such that the battery assembly receiving coils are not aligned orthogonal to the field of transmitting coil 201. According to embodiments of the present technology, with such placement, the effective reach of the coil's magnetic field is sufficient to couple to battery assemblies in most likely positions. In the case of a large battery-operated device, the user could be directed to position the battery end of the device downwards such that the rechargeable battery assembly(ies) is placed on surface 221. A battery pictorial on surface 221 could encourage the avoidance of orthogonal field alignment. Battery assemblies outside of a battery-operated device could also be placed on the slanted surface for charging.

Figure 11:
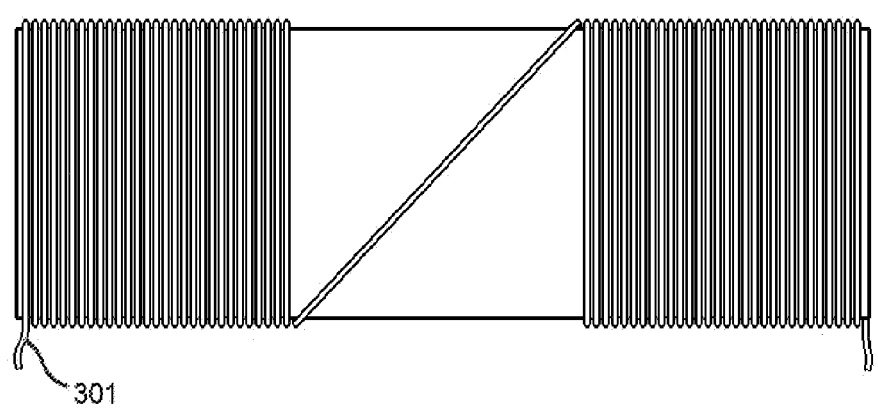
FIG. 11 is a top view of a transmit coil with a split winding used in accordance with embodiments of the present technology.

Other transmit coil configurations can be utilized. FIG. 11 depicts a split-winding embodiment where the windings of winding coil 301 are concentrated towards each end of the core, leaving a winding gap toward the middle of the core. As described in U.S. Pat. No. 7,206,426 issued to Julstrom et al., which is incorporated herein by reference in its entirety, such a configuration can help to maintain the induced field more parallel to the core length and the parallel components of the field more uniform in strength over a greater portion of the length.

Figure 12:
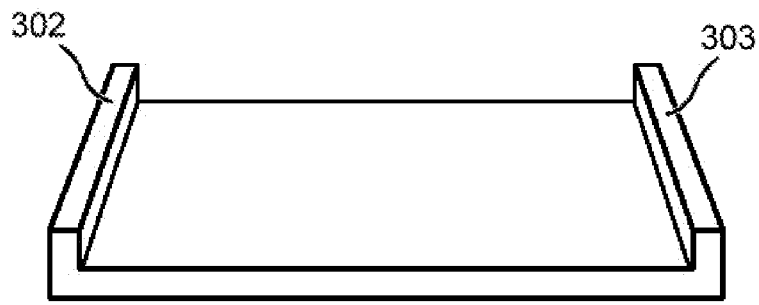
FIG. 12 is a perspective view of a transmit coil core with core end vertical risers used in accordance with embodiments of the present technology.

FIG. 12 depicts a core with vertical risers 302 and 303 at each end to form a core in the shape of a shallow "U". Such vertical risers can concentrate a greater percentage of the core's flux above the core rather than below it, in addition to further moving the flux lines near the core ends towards a more parallel orientation to the core length.

Figure 13:
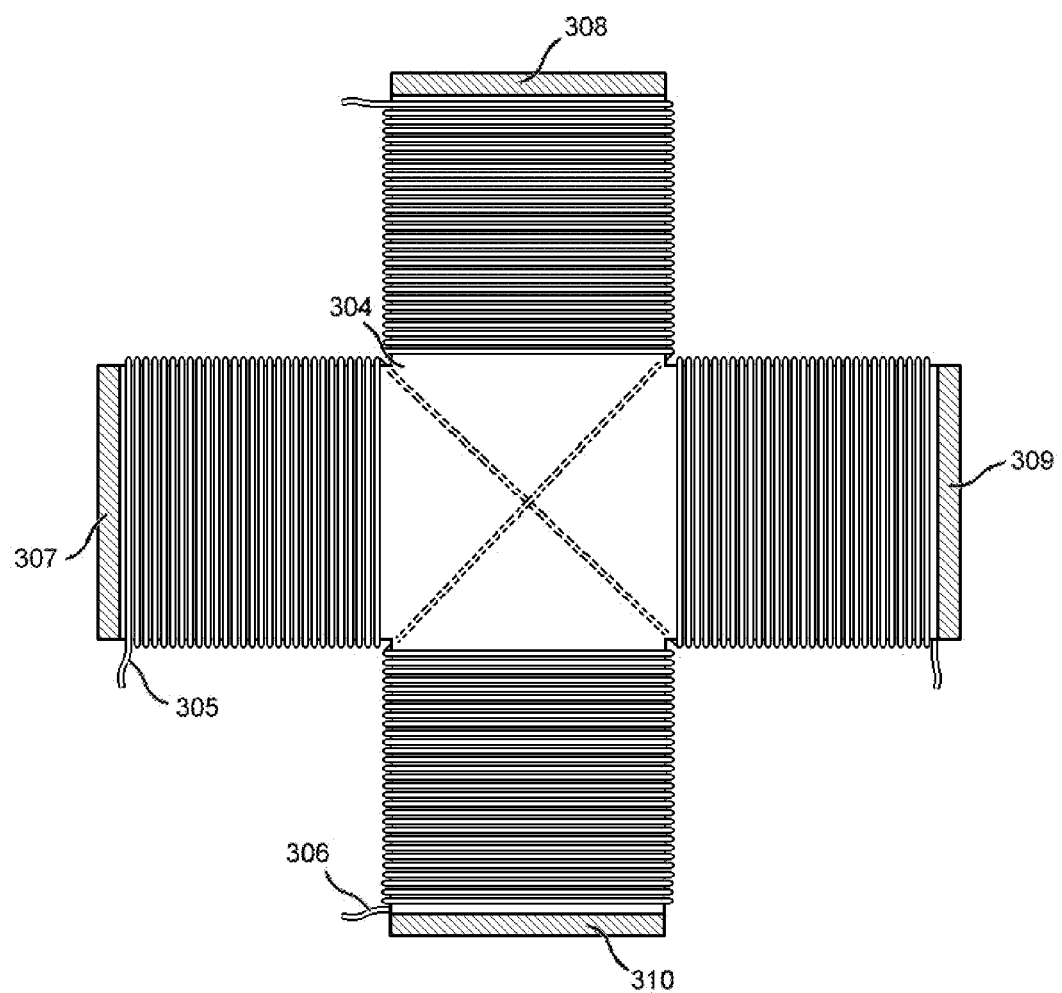
FIG. 13 is a top view of a dual-wound transmit coil assembly with core end vertical risers used in accordance with embodiments of the present technology.

FIG. 13 is a side view of a dual-wound transmit coil assembly with core end vertical risers. The cross-shaped core 304 illustrated can be advantageous for the winding of two crossed coils 305 and 306. Core 304 is shown including vertical risers 307-310. Driving the orthogonal coils in phase quadrature to create a rotating magnetic field could provide optimal alignment for any horizontal battery orientation, but this becomes problematic with two high-Q resonant coil circuits. The resonant frequencies will not generally match, especially when loaded unequally by nearby battery assemblies. However, a 45 degree misalignment between the battery assembly coil and the applied magnetic field is not a serious detriment with embodiments of the present technology. There is not, therefore, an advantage to driving the coil that is contributing less effective coupling. Rather, the control algorithm can be configured to test each coil to see which couples more effectively to the battery assembly (or assemblies) to be charged. The transmit coil that more strongly couples can continue to be driven for the remainder of the charge cycle, and the transmit coil that less strongly couples need not be driven for the remainder of the charge cycle.

As previously discussed in connection with FIG. 8, the magnetic flux lines produced by the transmit coil of FIG. 7A are only generally horizontal over the central region of the transmit coil. The construction variations of FIGS. 11 and 12 widen the region of horizontal flux lines, but do not make the field totally horizontal. A result of this is that even a vertically oriented battery assembly is likely to couple reasonably well, unless positioned at the center of the transmit coil.

In some cases, such as rechargeable battery assemblies or separate receiving coils for battery charging located inside hearing aids, the receive coil is likely to be positioned in any orientation. Coupling may be insufficient if the receive coil axis is oriented vertically over the center of the assembly of FIG. 13, horizontally over the outer edges of the assembly, or at certain oblique angles at intermediate positions. A third winding may be introduced to address such cases. For example, a third winding may be wound around the outside periphery of a dual-wound transmit coil assembly of FIG. 13. Core 304 could also be modified to be a different shape, such as rectangular, octagonal, or round, as shown for example in FIG. 14A by core 320. Orthogonal windings 321 and 322 produce generally horizontal fields over the central region of the core while circumferential winding 323 may produce a generally vertical field over the central region of the core, as illustrated by the estimated flux lines 324 of FIG. 14B, drawn over a center diameter of the core. Over the edge of the core, the fields from windings 321 and 322 become more vertical while the field from winding 323 becomes more horizontal. In the region above the plane of core 320 but outside its circumference, the fields from coils 321 and 322 again become more horizontal while the field from coil 323 becomes more vertical. Thus, effective coupling to any receive coil orientation is possible from at least one of the windings above the full surface area of core 320 and somewhat beyond.

Figure 14A:
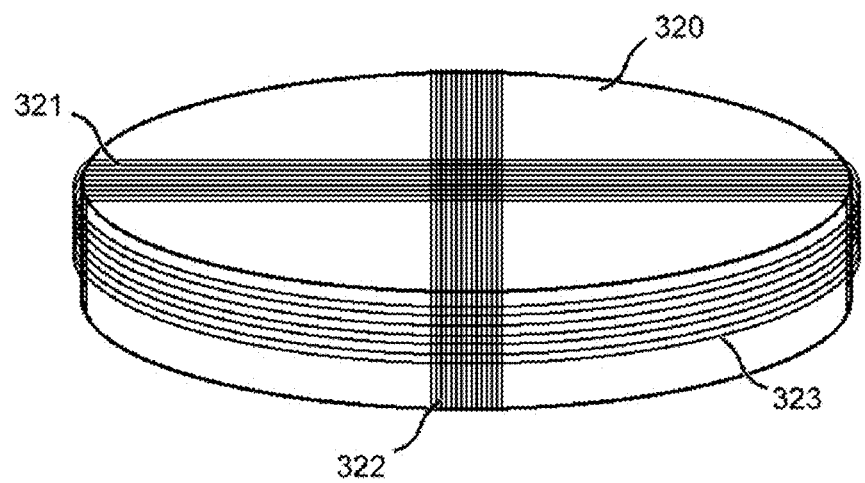
FIG. 14A shows a perspective view of a triple-wound transmit coil assembly used in accordance with embodiments of the present technology.
Figure 14B:
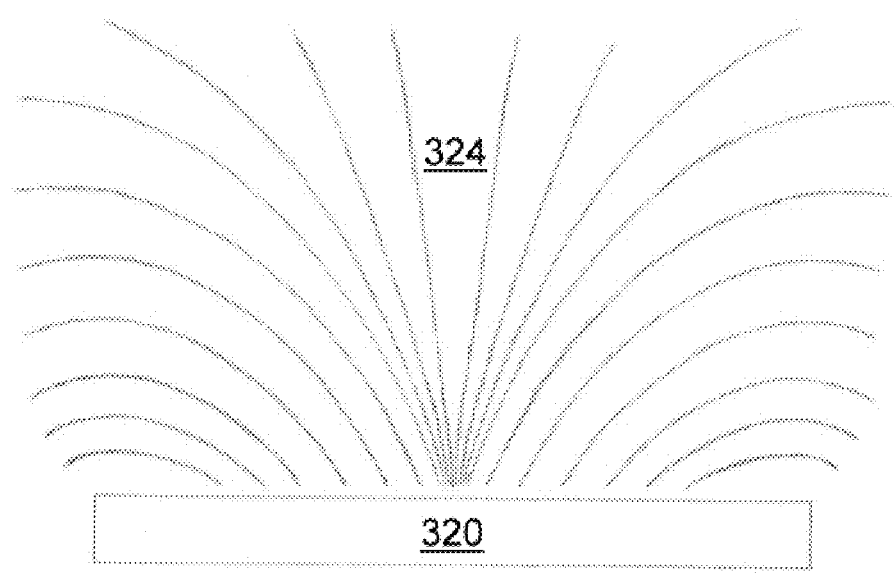
FIG. 14B is a plot of estimated flux lines above a diameter of the core for the circumferential winding of the triple-wound transmit coil assembly of FIG. 14A.
Figure 15A:
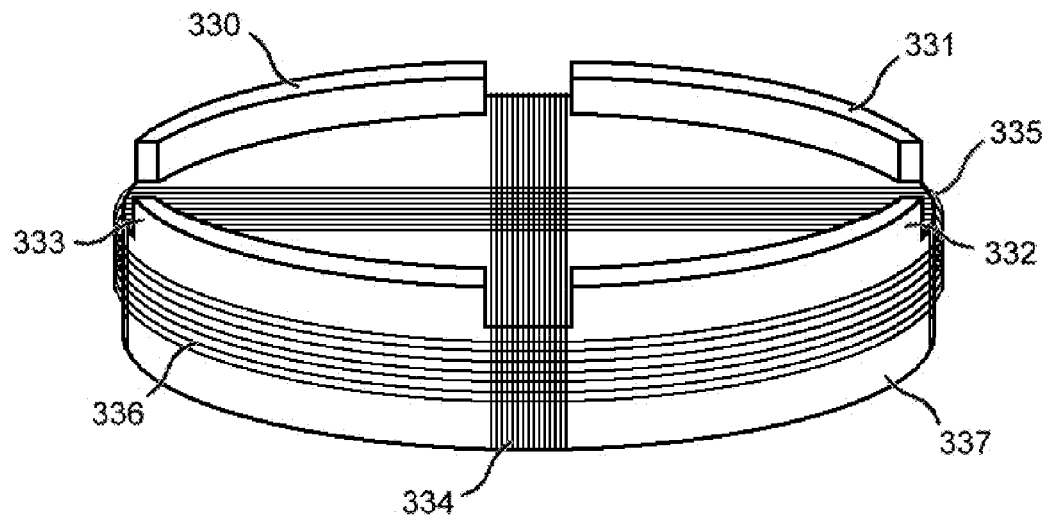
FIG. 15A is a perspective view of a triple-wound transmit coil assembly with vertical risers used in accordance with embodiments of the present technology.

In FIG. 15A, vertical risers 330-333 are added to the assembly of FIG. 14A, for generally the same reasons as discussed above in connection with the core of FIG. 12. Extending the generally horizontal field region of coils 334 and 335 becomes less important with the addition of circumferential coil 336, but urging a higher proportion of the flux above the core is still useful. Winding coil 336 around the top of core 337 keeps a higher proportion of its field above the core than below it. The gaps in the risers can serve as useful coil winding guides for coils 334 and 335.

Figure 15B:
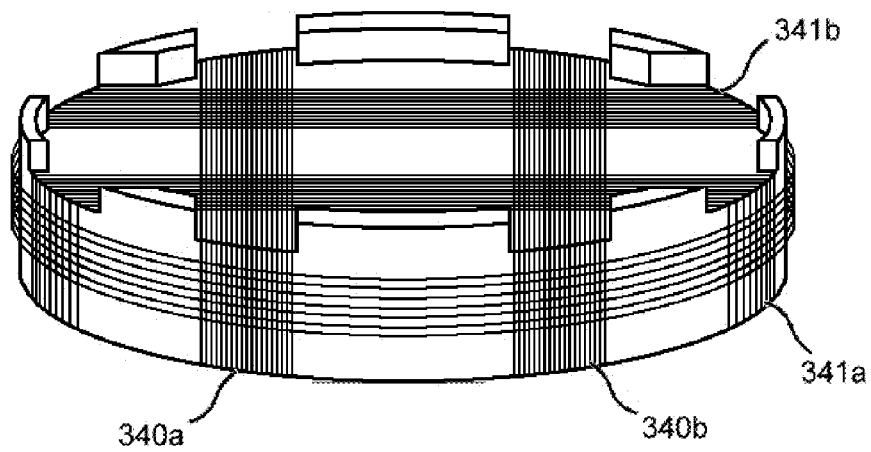
FIG. 15B is a perspective view of a triple-wound transmit coil assembly with split winding and vertical risers used in accordance with embodiments of the present technology.

FIG. 15B shows a triple-wound transmit coil assembly with an alternate winding for the core of FIG. 15A, where the orthogonal coils 340 and 341 are split, again for the reasons discussed above in connection with the core of FIG. 11. Coil 340 is split into two halves, 340a and 340b, and similarly coil 341 is split into halves 341a and 341b, as shown.

In triple-coil arrangements such as those shown in FIGS. 14A, 15A and 15B, the choice of which coil to drive in a given instance is made as described above in connection with FIG. 13, extended to a determination of the best of three coils instead of just two. The practicality of these various transmit coil possibilities is provided by the ability of the battery charging system of the present technology to achieve effective charging over a wide range of magnetic coupling strengths.

Figure 16:
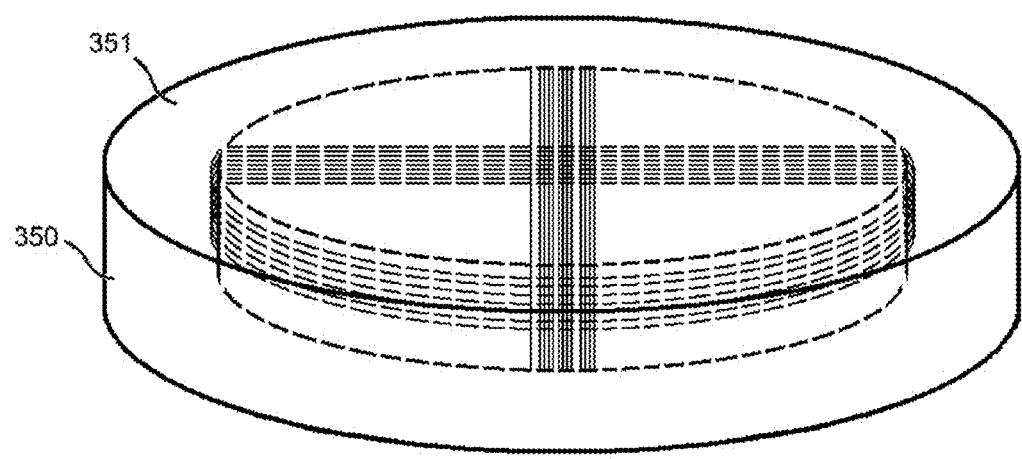
FIG. 16 is a perspective view of a housing used in connection with a transmit coil assembly used in accordance with embodiments of the present technology.

FIG. 16 shows a possible housing 350 for a circular transmit coil. A round upper surface 351 suggests to the user that positioning is not critical. A slight concavity to upper surface 351 can help prevent small devices from falling off.

Figure 17:
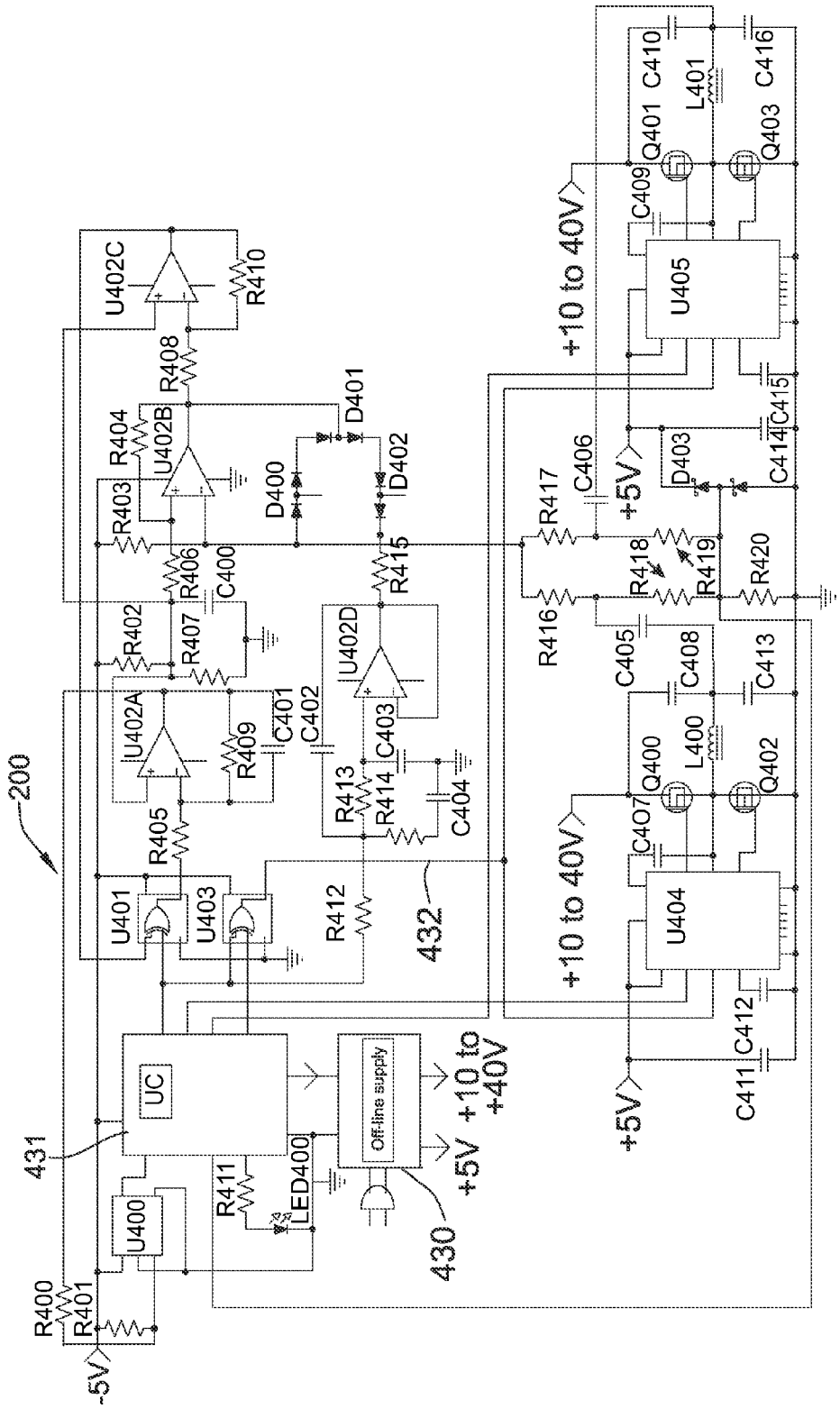
FIG. 17 is a schematic diagram of transmit circuitry used in accordance with embodiments of the present technology.

FIG. 17 is a schematic diagram of transmit circuitry 200 of FIG. 1, including extensions to drive both coils 305 and 306 of the dual-wound transmit coil assembly of FIG. 13. Coils 305 and 306 are represented in the schematic by 1.6 mH inductors L400 and L401. These coils are rectangular pulse driven by their respective drive circuits, comprising MOSFETs Q400 through Q403, such as Vishay type Si2308BDS or equivalent, for example, gate drive integrated circuits U404 and U405, such as Vishay type SiP41105 or equivalent, for example, and their associated capacitors. Inductor L400 series-resonates at 23 kHz with the parallel combination of 15 nF capacitors C408 and C413. Similarly, inductor L401 series-resonates with the parallel combination of capacitors C410 and C416. In certain embodiments, these capacitors can be low-loss metalized polypropylene parts of 5% or better tolerance and at least 250 volt rating, such as the Panasonic ECQ-P4153JU, for example. The combination of the low-loss capacitors and low-loss ferrite core transmit coil can form an unloaded resonant Q for each resonant circuit in the range of 80 to 120, depending on the operating level. This Q is sufficiently high so that only the fundamental component of the pulse drive results in significant current flow and resultant voltage generation at the junctions of the resonant components. When driven at resonance, the high Q enables a large magnetic field to be generated around the transmit coil while relieving the drive circuitry of the need to provide correspondingly large amounts of reactive drive power. The drive circuitry need only provide sufficient real power to overcome the resonant circuit losses and deliver coupled power to a secondary winding. The portion of the generated magnetic field that does not couple to a secondary is maintained through energy interchange with an associated resonating capacitor, rather than through the application of reactive power by the driving circuitry. While a high transmit resonant circuit Q of 80 or greater is desirable, a moderately high Q of 20 can be employed, albeit with decreased system efficiency and lessened battery sensing sensitivity.

In the depicted embodiment, MOSFETs Q400-403 are powered from a variable supply of 10 to 40 volts, enabling square wave drive of nearly 10 to 40 volts peak-to-peak, containing a fundamental sine wave component of 4.5 to 18

Vrms. This variable supply voltage is provided by off-line supply 430, which also provides the low-power 5 volt supply. Supply 430 does not need to provide isolation from the line and can be designed using known techniques. The high voltage that it produces is controlled by uComputer 431, which comprises a computer processor. uComputer 431 can be any of numerous 8-bit types having at least 6 MHz clock speed capability, one 8-bit A/D input, and a pulse width modulation section having a center-aligned PWM output, for example, the STMicroelectronics STM8S103F2 or, making allowances for the lower operating voltage, the Texas Instruments MSP430F1122, for example.

In the depicted embodiment, uComputer 431 outputs include: a single-pin, filtered, pulse width modulated D/A output that tells supply 430 to output a voltage between 10 volts and 40 volts; a single-pin PWM LED drive output to control the brightness of an LED that indicates to the user that charging is taking place and the approximate effectiveness of the charging, as will be described; and two coil enable outputs that determine whether a coil drive circuit will be active and which circuit it will be. A uComputer 431 A/D input reads the resonant voltage of the active transmit resonant circuit, scaled by either divider R418-R420 or divider R419-R420. Dual diode D403, such as type BAT54S or equivalent, for example, clamps off the negative half cycle and limits the scaled positive half cycle to the uComputer's supply voltage. The uComputer times its A/D input capture so that the reading is taken near the peak of the sine wave.

Figure 18:
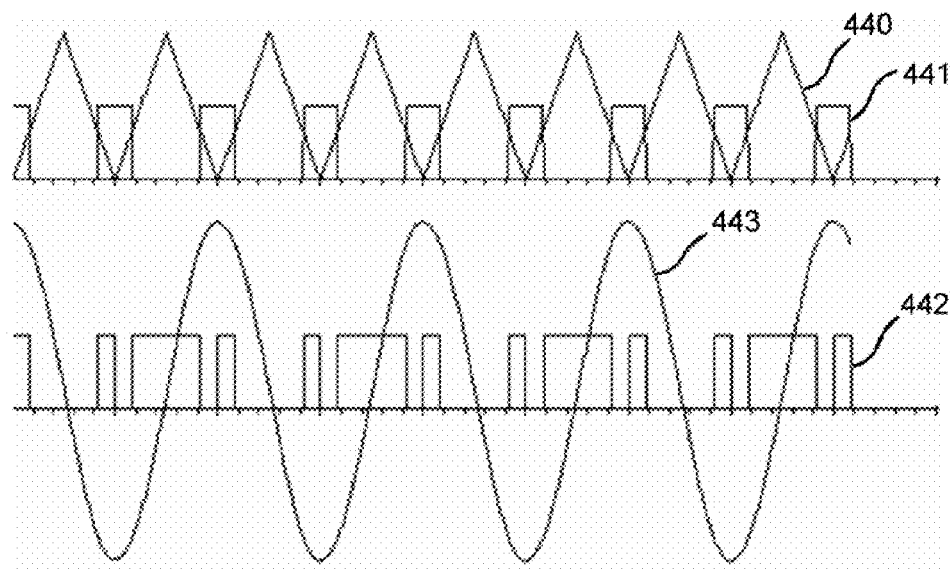
FIG. 18 is a diagram depicting a drive voltage pulse width modulation operation used in accordance with embodiments of the present technology.
Figure 19:
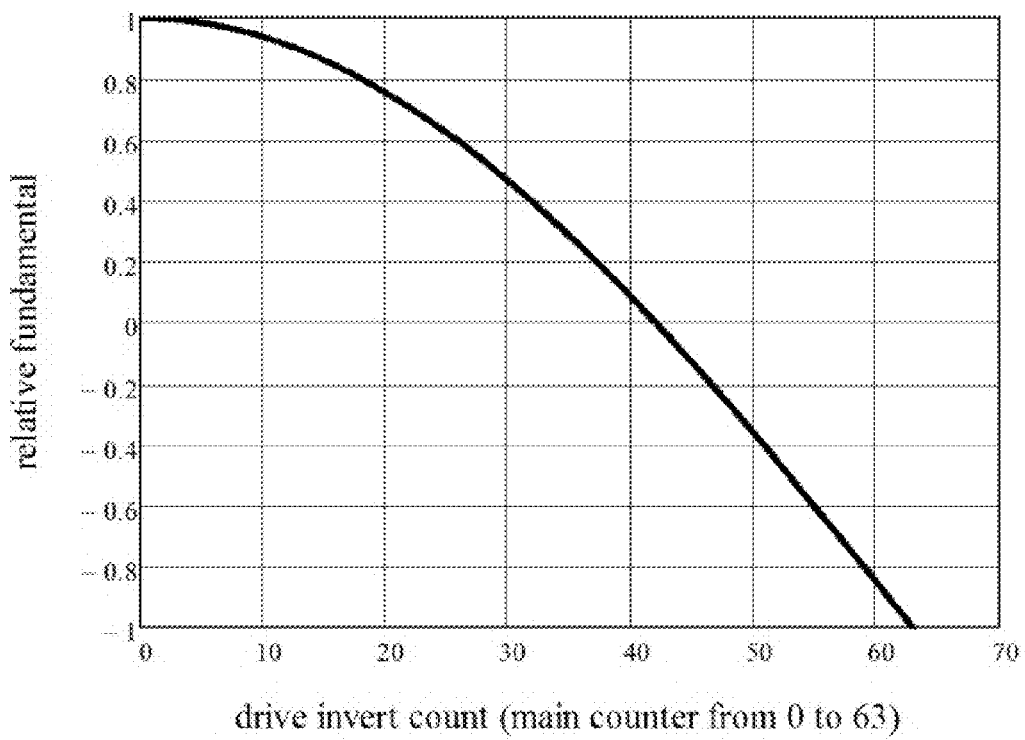
FIG. 19 is a graph depicting the effect of drive voltage pulse width modulation used in accordance with embodiments of the present technology.

In the depicted embodiment, uComputer 431 outputs a roughly 23 kHz square wave at its Fdrive out. This square wave is modified by exclusive OR gate U403, such as a Fairchild type NC7S86 or equivalent, for example, before becoming the signal driving gate drive integrated circuits U404 and U405 along conductor 432. The remaining input to gate U403 comes from the drive invert out of the uComputer. This connection allows the uComputer to smoothly and rapidly control the amplitude of the fundamental component of the transmit resonant circuit drive voltage between the 4.5 Vrms produced by pure square wave drive from a 10 volt supply down to 0 Vrms drive. FIG. 18 is a graph depicting how this is accomplished. In FIG. 18, waveform 440 represents the state of the internal timer counter of uComputer 431 as it counts up and down between 0 and 63. Each time the count reaches 0, Fdrive out is toggled. Thus, the count frequency, which can be taken as the uComputer clock frequency input at clk in, is 256 times the frequency of Fdrive out. Waveform 441 represents a typical logic signal at drive invert out. This is produced using the center-aligned PWM output capability of the uComputer. Waveform 442 represents the logic signal at the output of exclusive OR gate U103 appearing on conductor 432. It is equal to the Fdrive out signal except that it is inverted when the drive invert out signal is high. Its fundamental component is reduced in comparison to the pure square wave of Fdrive, but still is in phase with Fdrive. The impact of this will become more apparent in connection with the discussion to follow of the method used to maintain drive at transmit circuit resonance. Waveform 443 represents the resultant voltage waveform produced by the driven LC circuit when driven at its resonance. Basically only the fundamental is present and it is phase-shifted −90 degrees from the fundamental component of the drive signal. As the drive invert main timer count threshold point varies up from a count of 0, the fundamental component of the signal appearing on conductor 432, and thus the drive signal to inductor L400 or L401, is reduced. This effect is plotted in FIG. 19. At a drive invert threshold of 0, the full square wave is applied and the full fundamental component appears. When the drive invert threshold reaches a count of 42 (⅔ of 63), the drive signal becomes a square wave at 3 times the frequency of Fdrive with no component at the Fdrive frequency. As the drive invert threshold count exceeds 42, the fundamental component becomes reversed in polarity. In practice, the control program directs the drive invert threshold to rest at a count of 42. The applied fundamental is made to ramp up by ramping the drive invert threshold count down towards 0.

As has been discussed, charge system functioning can be improved if the drive to the transmit coil (primary) is maintained at or close to the LC circuit's resonant frequency. To achieve the full benefit, the resonant drive should be maintained while allowing for variations in the coil and the capacitor impedances due to tolerances and changes due to magnetic field loading by battery assemblies or paramagnetic materials in charging devices. This task is accomplished by the action of an inventive resonance-locked loop ("RLL"). Its operation is related to that of a conventional phase-locked loop ("PLL"), but differs in that it has no frequency reference signal. A conventional PLL locks onto a reference signal and matches its own oscillator's frequency to that of the reference signal or a multiple or sub-multiple of it. In contrast, the RLL seeks out the resonant frequency of a circuit block based on its phase vs. frequency transfer function.

Figure 20:
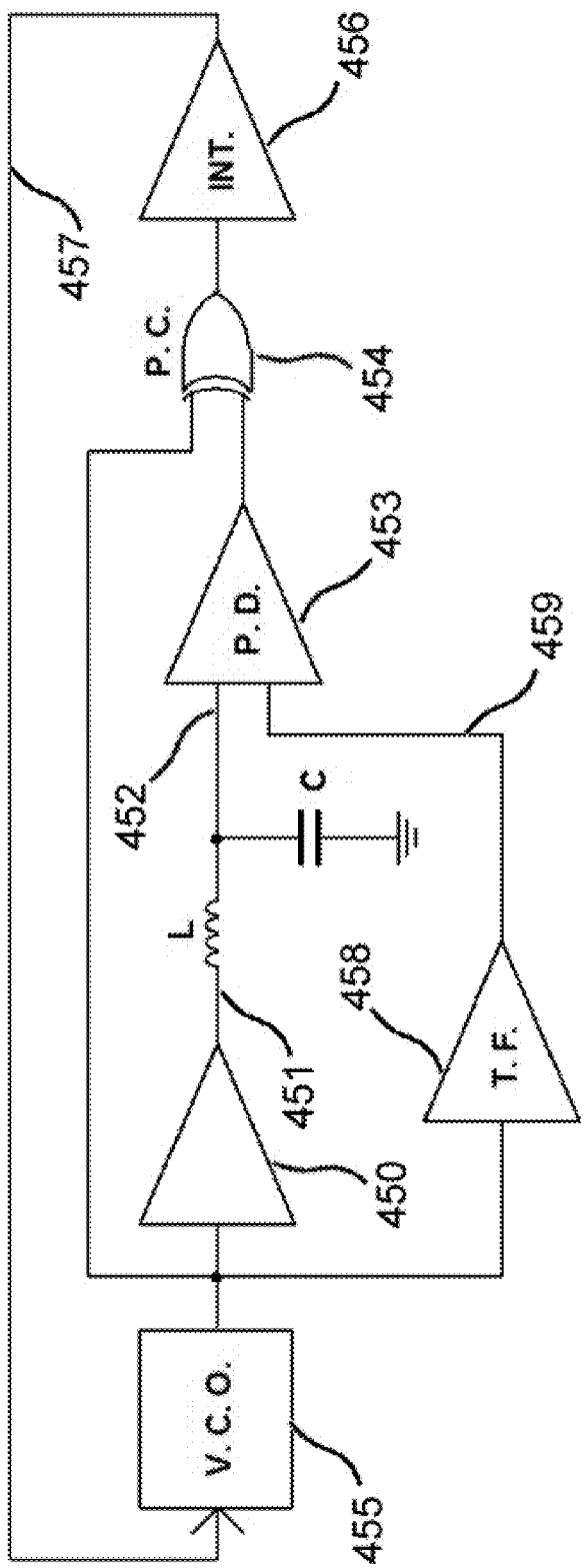
FIG. 20 is a schematic diagram representing a resonance locked loop used in accordance with embodiments of the present technology.

FIG. 20 is a diagrammatic representation of the RLL embedded in the schematic of FIG. 17. In FIG. 20, drive circuit 450 produces a pulse waveform on conductor 451, which is applied to the resonant circuit comprising inductor L and capacitor C. The signal appearing on conductor 452 is a low-pass filtered version of the signal on conductor 451. The phase vs. frequency characteristic of the L-C circuit includes a 90 degree phase lag at its resonance. Phase detector 453 outputs a near-square wave at the fundamental frequency of the signal on conductor 452. This becomes one input to phase comparator 454, whose other input is the original square wave input to drive circuit 450, which is produced by voltage-controlled oscillator 455. Phase comparator 454 produces an output signal whose average output level varies uniformly over its range as the phase difference between its inputs varies between 0 and 180 degrees. A 90 degree phase shift between its inputs results in a middle-of-the-range output from phase comparator 454. Integrator 456 integrates the difference between the phase comparator output and its midrange, 90 degree phase difference level, and varies the output voltage appearing on conductor 457 in a direction so as to adjust voltage-controlled oscillator 455 to produce an output frequency that results in a 90 degree phase shift in the L-C resonant circuit. In this manner, the RLL locks onto the resonant frequency of the L-C circuit. The RLL can be tolerant of a wide range of choices for the gain constants of its various blocks and the speed of the integrator. Unlike a conventional PLL, the inventive RLL can remain stable over a wide range of parameter choices and variations. With the parameters of the schematic of FIG. 17, lock is achieved within just a few cycles of the Fdrive frequency.

As has been discussed, the operation of the FIG. 17 embodiment allows for the modification of the transmit coil drive signal so as to lower its fundamental component all the way down to 0. This can be modeled in the diagrammatic representation of FIG. 20 by declaring drive circuit 450 to have variable gain down to 0. Under the condition of zero gain in circuit 450, the RLL as thus far described will tend to free-run at the lowest or highest frequency within the range of oscillator 455. The RLL cannot begin to function until the resonant voltage at conductor 452 has increased to a level sufficient to activate phase detector 453. However, this resonant voltage remains small when the fundamental component of the drive signal at conductor 451 is small and off-resonance. While not posing a large practical problem, improved L-C drive at these very low levels can be achieved by forcing oscillator 455 to a rest frequency closer to the unloaded L-C resonance frequency, which can be near the center of the oscillator range. Near-resonant drive can then be achieved even at very low drive levels, providing higher corresponding resonant voltages at conductor 452 and leading to RLL lock-in at lower drive levels. This benefit is achieved in the example of FIG. 20 by the addition of optional parallel transfer function path 458. This comprises of a $2^{nd}$ order low-pass filter with substantially the same characteristic frequency as the L-C resonant circuit and therefore a 90 degree phase shift at substantially the same frequency. Just enough signal is fed from transfer function 458 along conductor 459 to excite phase detector 453 and enable the RLL to lock in on the characteristic frequency of transfer function 458. When sufficient signal is developed on conductor 452 from the L-C resonant circuit, that signal can dominate and the RLL can lock in on the desired L-C resonance.

Referring again to FIG. 17, the drive circuitry comprising either U404, Q400, Q402 and associated parts or U405, Q401, Q403 and associated parts, whichever is being driven, correspond to drive circuit 450 of FIG. 20. The modifications to the drive signal contributed by the drive invert out of uComputer 431 acting through gate U403 and the uComputer's high voltage control correspond to the variable gain aspect of circuit 450. Either L400, C408, and C413 or L401, C410, and C416, whichever is being driven, correspond to the L-C resonant circuit of FIG. 20. Clipping amplifier U402B and associated parts, including either C405 and R416 or C406 and R417, which ever is being driven, and inverting amplifier U402C correspond to phase detector 453. Exclusive OR gate U401 corresponds to phase comparator 454. Integrating amplifier U402A and associated parts corresponds to integrator 456. The function of voltage controlled oscillator 455 is provided by the combination of integrated circuit oscillator U400, such as a Linear Technology type LTC 1799 or equivalent, for example, and associated resistors R400 and R401, and uComputer 431. Oscillator U400 provides the master clock signal for the uComputer. As discussed in connection with FIG. 18, the uComputer produces at Fdrive out a square wave equal to its clock signal frequency divided by 256. Oscillator U400 can produce a range of clock frequencies from 5.12 MHz to 6.66 MHz, which then can become Fdrive frequencies of 20 kHz to 26 kHz. Finally, U402D and associated parts form an under-damped low-pass filter with a characteristic frequency of 23 kHz, corresponding to transfer function 458 of FIG. 20.

The schematic diagram of FIG. 17 is appropriate for a dual-wound transmit coil assembly such as that of FIG. 13. For a single-wound assembly such as those of FIG. 7 or FIG. 11, L401 would be removed from FIG. 17, along with its associated resonating capacitors, drive circuitry components, and C406, R417, and R419. For a triple-wound transmit coil assembly such as those of FIGS. 14A, 15A and 15B, corresponding parts would be added.

Figure 21:
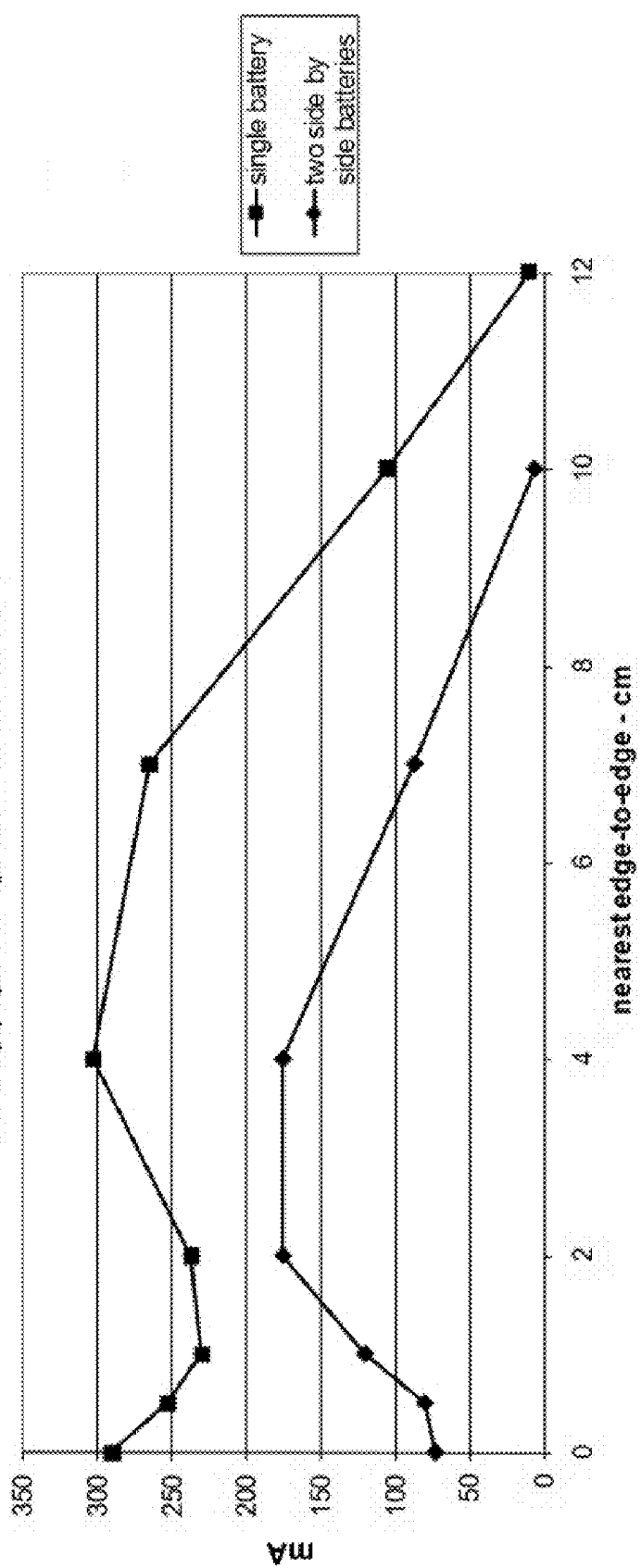
FIG. 21 is a graph depicting representative measured charge current vs. distance when a rechargeable battery assembly(ies) of FIG. 4 is aligned over the longitudinal center line of the transmit coil of FIG. 7A.

Representative measured performance of a single-wound assembly according to FIG. 7 charging one or two battery assemblies constructed magnetically generally according to FIG. 4 is plotted in FIG. 21. The battery assemblies are aligned with the magnetic field of the charging coil and positioned at the indicated distances above the center of the charging coil. The charging coil is driven from a square-wave source with a fundamental frequency component of 4 Vrms through a series resistance of about 0.5 Ohm. The charging current of each battery of a side-by-side pair is seen to be roughly one-half that of a single battery, but both conditions exhibit fairly uniform charging currents out to a distance of about 7 cm. This desirable behavior is achieved in spite of the 9:1 variation in magnetic coupling over the spacing range of 0 to 7 cm, as graphed in FIG. 9. In practice, spacing less than 0.5 cm will not occur due to the housing thicknesses of the charger and the charged device, leaving a practical field strength range from 0.5 to 7 cm spacing of 7:1. FIG. 21 does not speak to sensitivity to rotation of the battery assembly away from the ideal alignment with the charger's magnetic field. However, a rotation of 45° results in a 30% loss in coupling, which is relatively small when the charging system's coupling range acceptance is considered.

While the charging currents depicted in FIG. 21 are substantial, particularly for the single battery condition, the battery assembly described in connection with FIGS. 4, 5, and 6 can accept higher charge rates of up to about 450 mA before magnetic saturation of its core. As will be discussed, the control algorithm can raise the transmit resonant circuit drive voltage above the levels depicted in FIG. 21 to increase the charging current, potentially up to a maximum determined by battery assembly core saturation.

Figure 22:
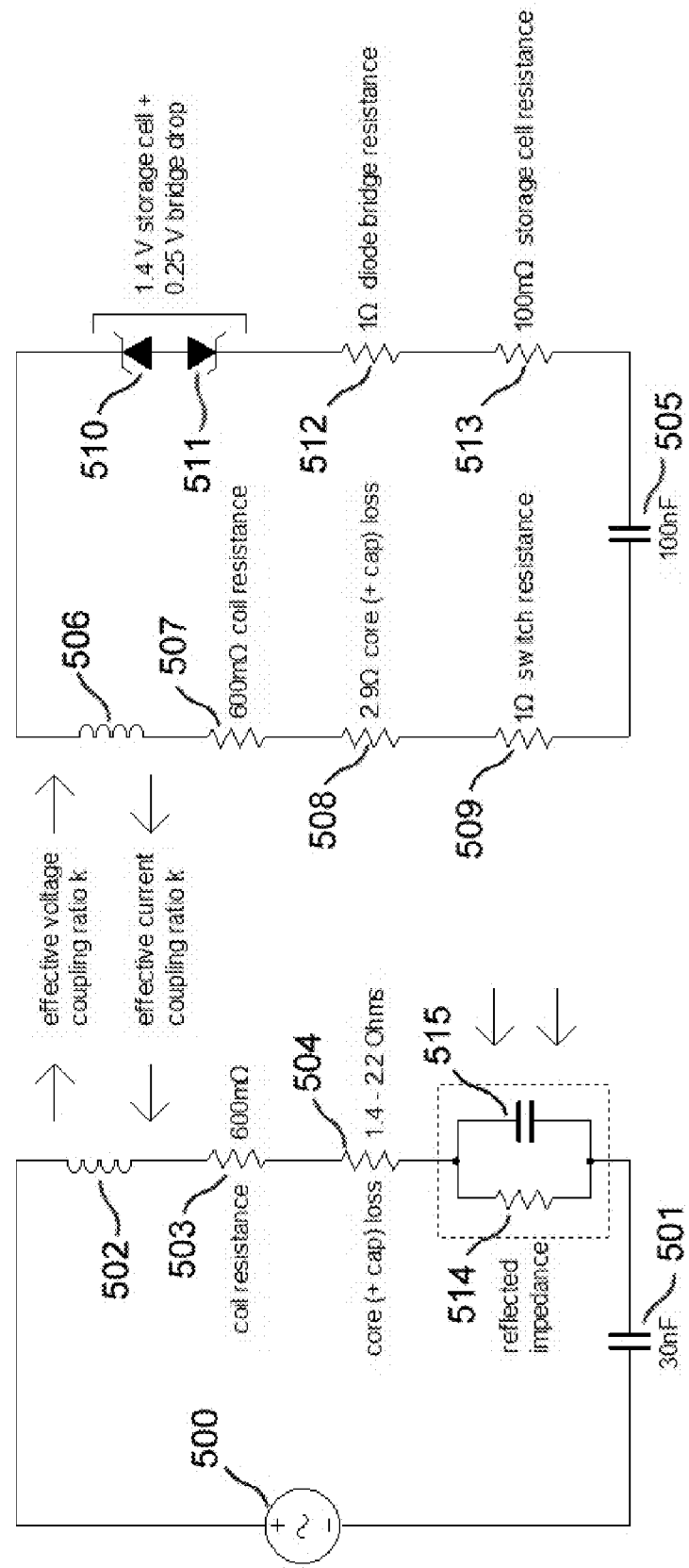
FIG. 22 is a schematic diagram of an electrical model of a single transmit coil to a single battery charging system used in accordance with embodiments of the present technology.

The single battery charging system comprised of a single-wound assembly according to FIG. 7 charging a single battery assembly constructed magnetically generally according to FIG. 4 can be modeled by the equivalent circuit of FIG. 22. Sine wave voltage source 500 represents the fundamental component of the pulse drive waveform, locked in frequency to the resonance of its series-connected load elements. Low-loss 30 nF capacitor 501 resonates with the inductive portion of the transmit coil, represented by inductor 502. O.6 Ohm resistor 503 is the coil resistance of the transmit inductor, while 1.4 to 2.2 Ohm resistor 504 represents the transmit core losses, along with any losses in capacitor 501. On the battery side, 100 nF capacitor 505 is the low-loss resonating capacitor, inductor 506 represents the inductive portion of the receive coil, 0.6 Ohm resistor 507 its coil resistance, and 2.9 Ohm resistor 508 its core losses, along with any losses in capacitor 505. 1 Ohm Resistor 509 approximately represents the series loss of the charge control switch transistor. The combination of the power absorbed by the storage cell and the full-wave bridge rectifier is represented approximately by back-to-back zener diodes 510 and 511 and resistors 512 and 513. The storage cell is modeled as a 1.4 volt drop in series with 0.1 Ohm. The full wave Schottky bridge rectifier is modeled roughly as a 0.25 volt drop in series with 1 Ohm.

As depicted in FIG. 22, the transmit and receive portions of the model are linked by the coupling between inductors 502 and 506, represented by a coupling factor k. The factor represents the flux coupling, as graphed in FIG. 9, modified by the turns ratio between the inductors. In the forward direction, this factor is multiplied times the voltage across inductor 502 to find the open circuit voltage across inductor 506. In the reverse direction, the same factor is multiplied times the current in inductor 506 to find the reflected current in inductor 502. At coil separations greater than about 2 cm, the transmit and receive circuit resonances do not interact significantly and both stay in resonance, leaving only the resistive portions of their circuits to analyze. The loading reflected to the transmit circuit is represented by resistor 514. As can be seen in the single battery curve of FIG. 21, an impedance match results at a separation of 4 cm between the reflected resistance and the transmit circuit series resistances that results in maximum power transfer to the battery circuit for the given drive voltage. At closer separations, power transfer is more efficient, but the higher reflected resistance lowers the total power being drawn from voltage source 500. Increasing the number of receive coil turns would move the impedance match point to a greater separation distance while lowering the total power being drawn from the source for a given drive voltage. Decreasing the number of receive coil turns would move the impedance match point to a closer separation distance while increasing the total power being drawn from the source for a given drive voltage.

With coil separations closer than 2 cm, the transmit and receive coils link sufficiently so as to modify their respective inductances, resulting in small changes to the transmit and receive circuit resonant frequencies. The transmit circuit resonant frequency increases slightly and that of the receive circuit decreases. The driving circuitry RLL provides that the driving frequency follow the transmit circuit resonance, which then leaves some receive circuit inductance that is not resonated out by capacitor 505. This can become part of the impedance that is reflected to the primary circuit. This portion of the reflected impedance is represented by capacitor 515. The net effect is to lower the total series resistance loading voltage source 500 and thus to draw more power than would otherwise be the case. The result can be seen in the single battery curve of FIG. 21 where the charging current increases for close spacing of less than 1 cm.

As depicted in FIG. 22, the reflected resistance 514 can be expressed as a function of average battery charging current $I_{bat}$ and coupling factor k:

$$R_{sref}(k, I_{bat}) := \frac{(235 \cdot k)^2}{5.6 + \frac{1.65 \cdot 0.9^2}{I_{bat}}} \cdot \frac{1}{1 + \left(\frac{142000 \cdot 0.03 \cdot k^{2.4}}{5.6 + \frac{1.65 \cdot 0.9^2}{I_{bat}}}\right)^2}$$

Figure 23:
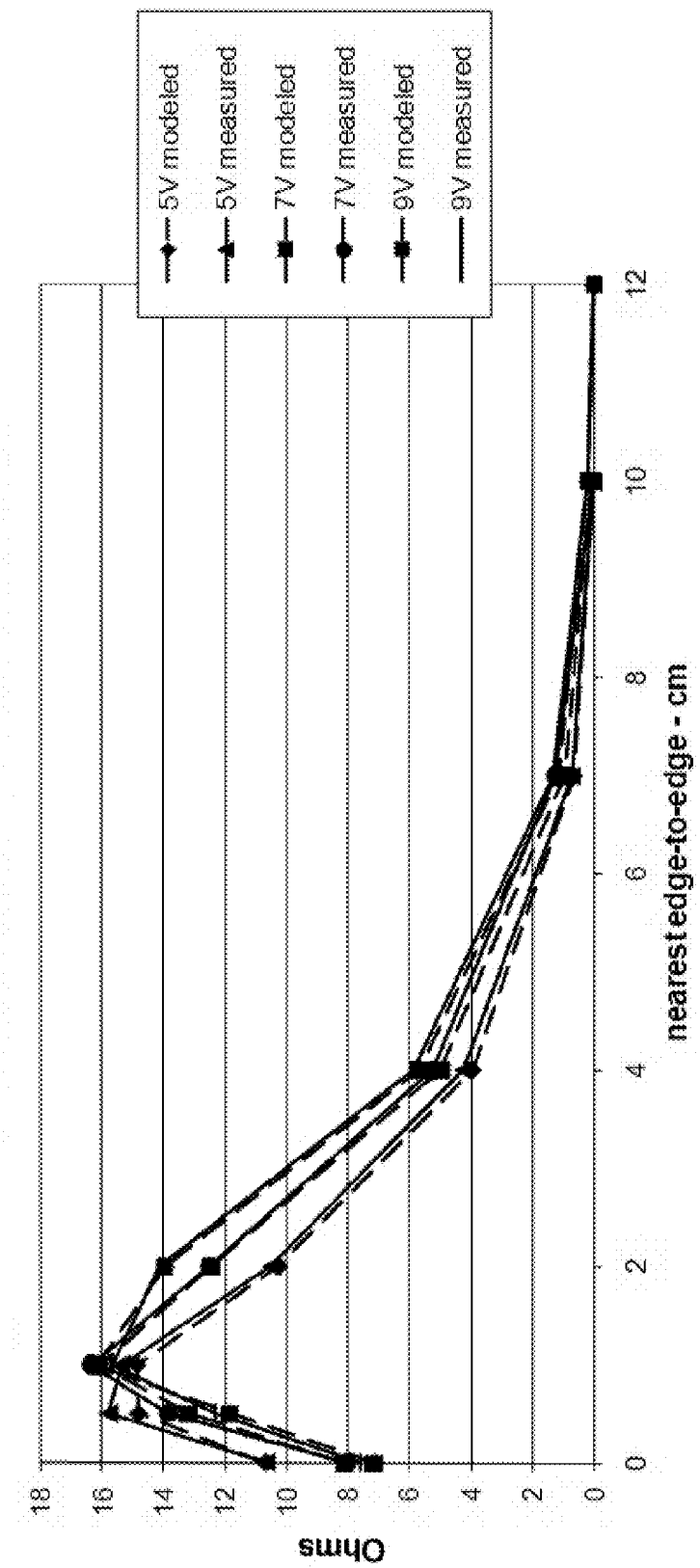
FIG. 23 is a graph depicting the modeled and measured reflected resistance vs. separation distance in accordance with embodiments of the present technology.

The factor of 235 in the numerator is the characteristic impedance in Ohms of the transmit resonant circuit comprising 30 nF capacitor 501 and inductor 502, in the case of the particular modeled prototype equal to 1.65 mH. The resonant frequency of 22.6 kHz is equal to 142,000 rad/sec. The factor $142{,}000 \times 0.03 \times k^{2.4}$ empirically models the unresonated secondary inductance at close coil spacing. The graph of FIG. 23 shows good agreement between the calculated results from this formula and measured data at three different supply voltages.

The validity of the FIG. 22 model is also confirmed by developing an expression for average battery charging current $I_{bat}$ as a function of coupling factor k and the rms voltage across the transmit coil, including all series elements of the modeled transmit circuit except for resonating capacitor 501, and represented by the term $V_1$ in the following equation:

$$I_{bat}(k, V_1) := 0.9 \cdot V_1 \cdot k \cdot \frac{\left[1 - \frac{1}{\pi} \cdot \left[\frac{1.65}{V_1 \cdot k} \cdot \sqrt{2 - \left(\frac{1.65}{V_1 \cdot k}\right)^2} + 2 \cdot \mathrm{asin}\left(\frac{1.65}{\sqrt{2} \cdot V_1 \cdot k}\right)\right]\right]}{\sqrt{5.6^2 + \left[1 - \frac{1}{\pi} \cdot \left[\frac{1.65}{V_1 \cdot k} \cdot \sqrt{2 - \left(\frac{1.65}{V_1 \cdot k}\right)^2} + 2 \cdot \mathrm{asin}\left(\frac{1.65}{\sqrt{2} \cdot V_1 \cdot k}\right)\right]\right]}{(142000 \cdot 0.03 \cdot k^{2.4})^2}}$$

Figure 24:
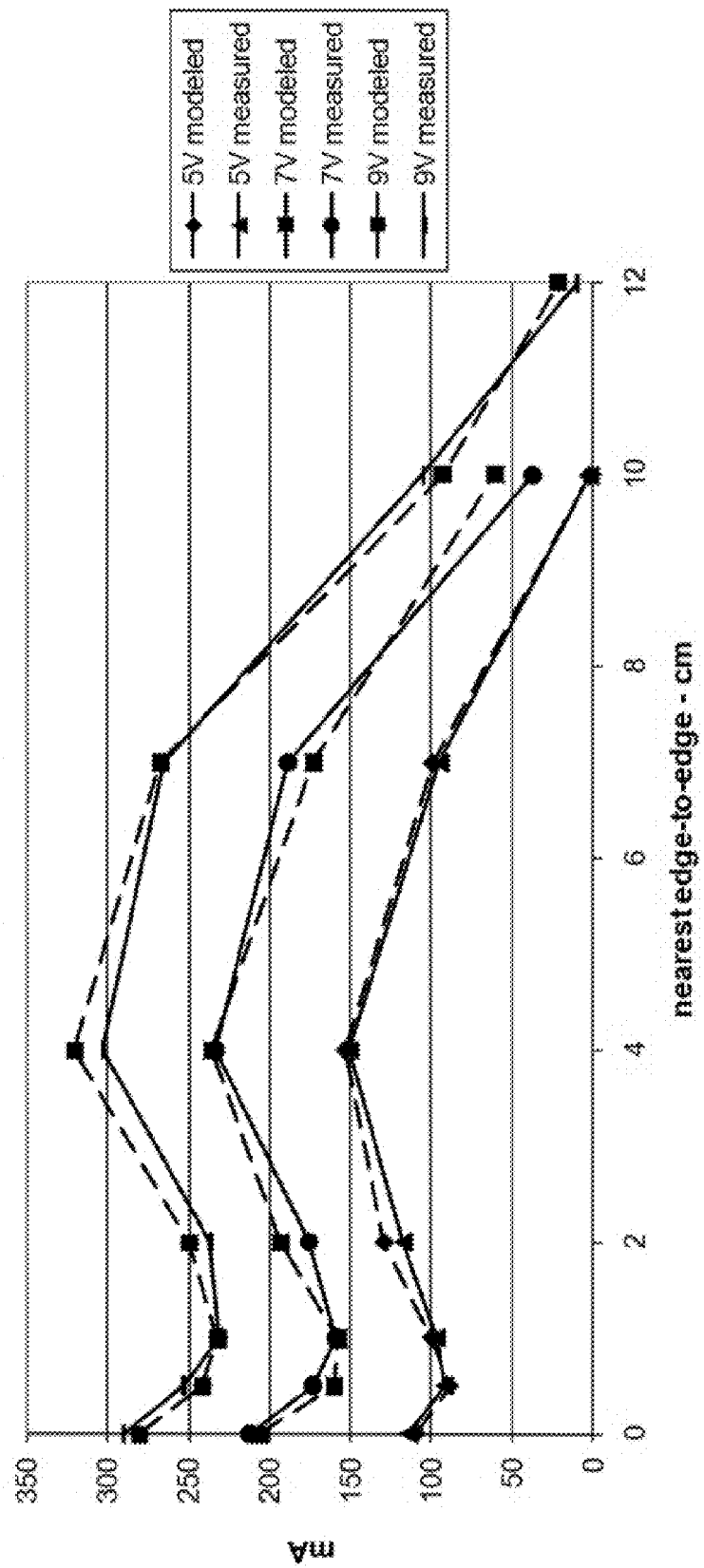
FIG. 24 is a graph depicting the modeled and measured battery charging current vs. separation distance in accordance with embodiments of the present technology.

The graph of FIG. 24 shows good agreement between the calculated results from this formula and measured data at three different supply voltages.

Figure 25A:
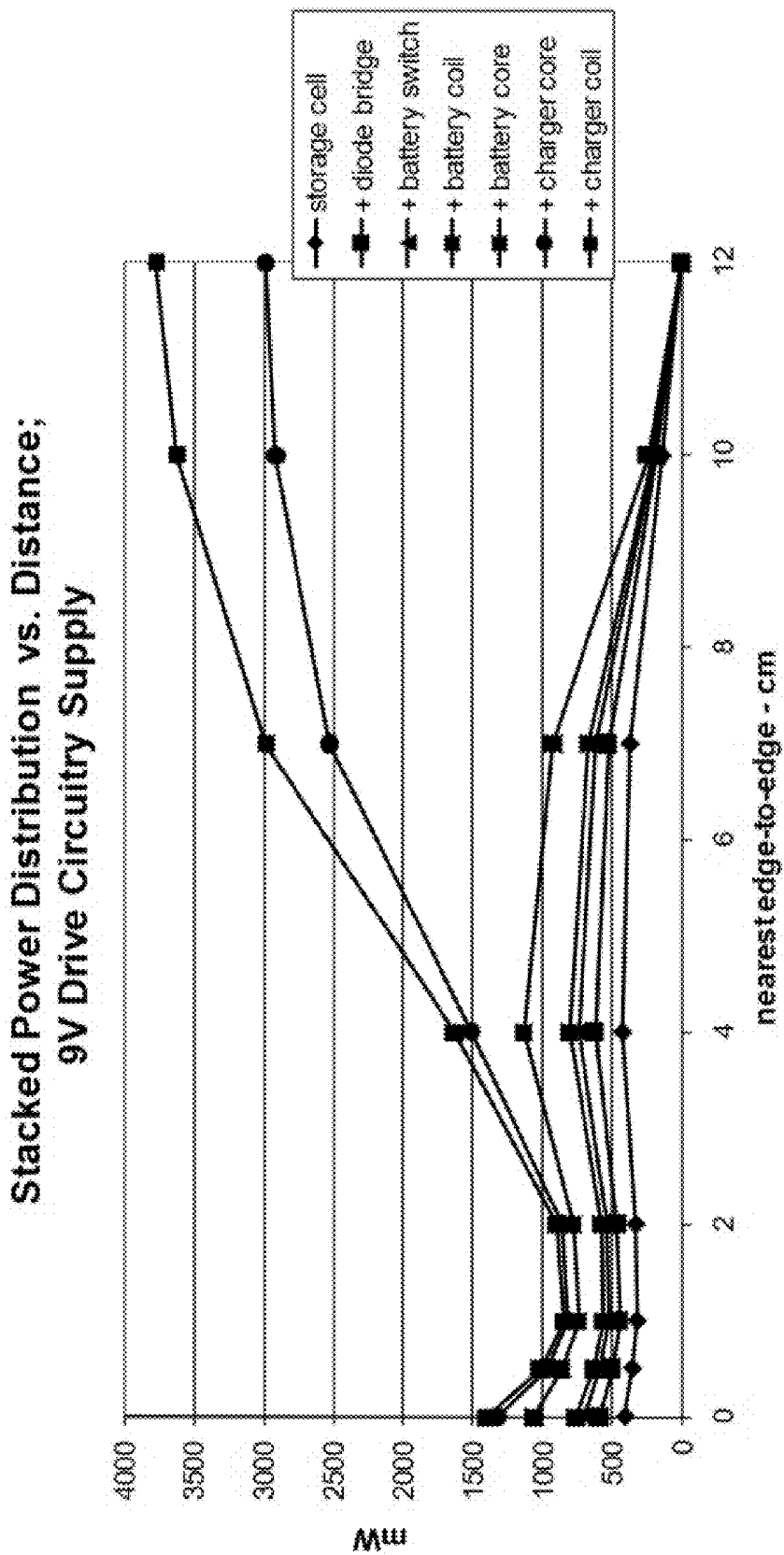
FIG. 25A is a graph depicting the system power loss distribution (in power) vs. distance in accordance with embodiments of the present technology.
Figure 25B:
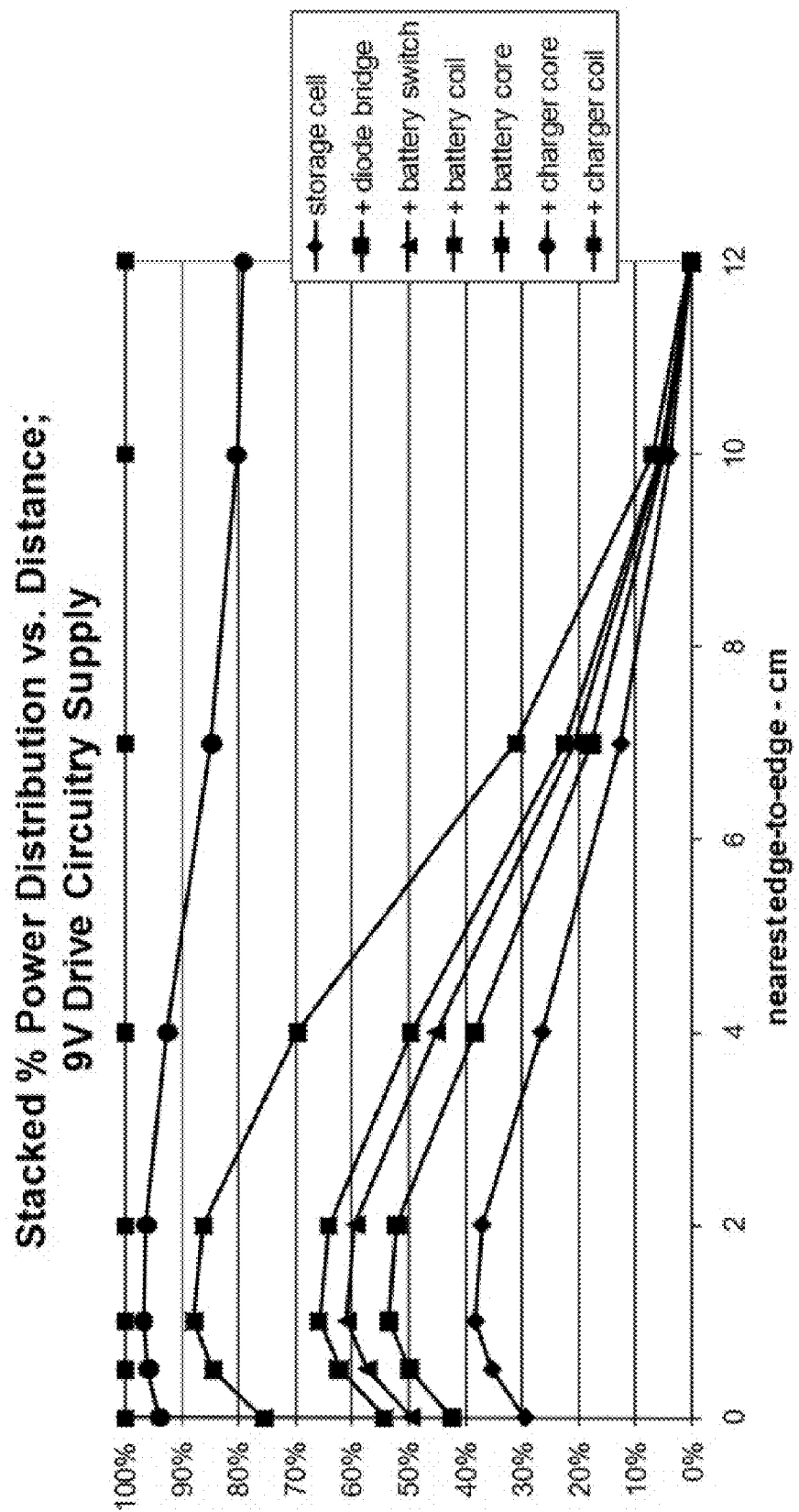
FIG. 25B is a graph depicting the system power loss distribution (in percentage) vs. distance in accordance with embodiments of the present technology.

The theory and measurements can be combined to deduce the power loss distribution in the various elements of the transmit and receive circuits. FIG. 25A shows in milliWatts and FIG. 25B shows in the percentage of input power where the power is lost on the way to the lowest curve in each case, the storage cell. The highest curve in each case represents the power going into the transmit coil, ignoring drive circuit losses. As can be seen, the net charging efficiency is relatively high at close distances, and falls off at the greater coil separations. However, due to the low-loss transmit coil design and the overall system operation, effective charging can be maintained at coil separations of 7 cm and beyond.

Figure 26:
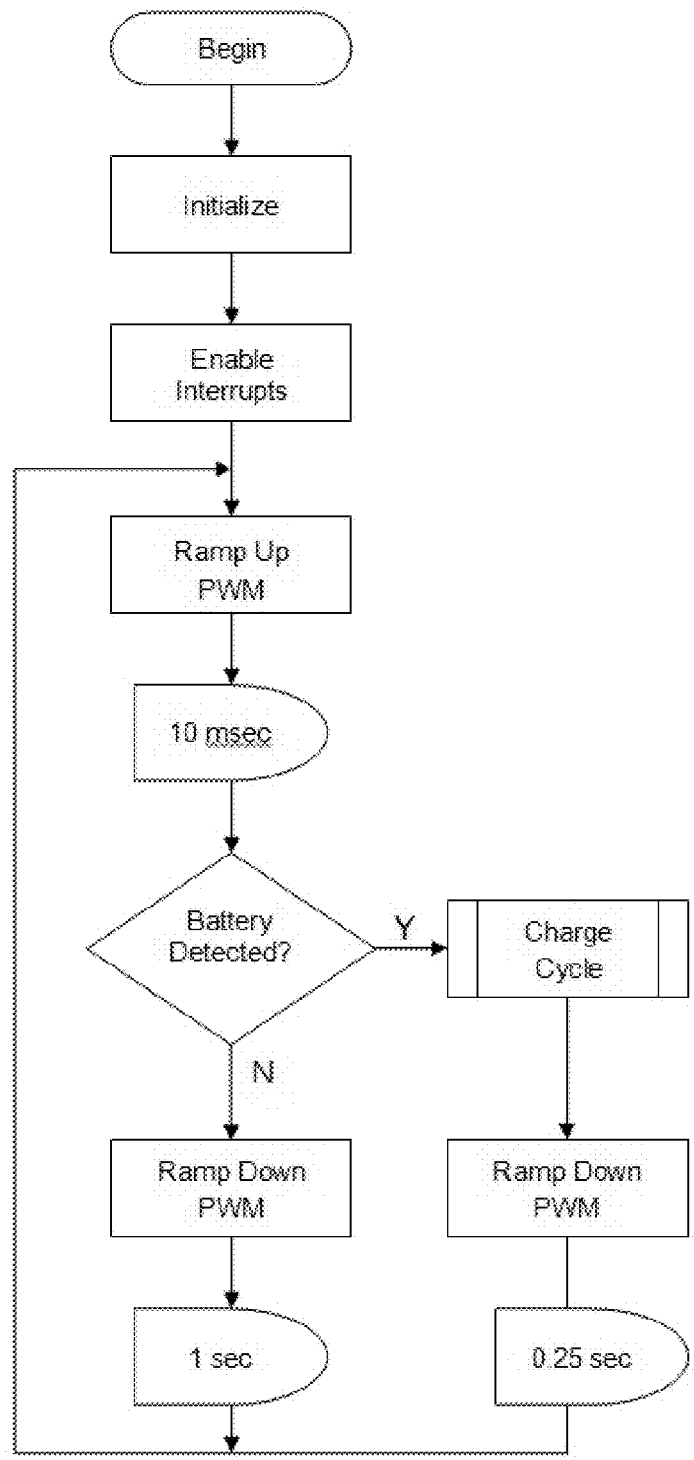
FIG. 26 is a flow chart depicting a main program loop used in accordance with embodiments of the present technology.

The main loop of a control program executed by uComputer 431 of FIG. 17 is outlined in FIG. 26 for a system with a single-wound transmit coil. Following initialization, the drive circuitry supply is at 10 volts. The program ramps the effective fundamental drive voltage up from 0 Vrms to typically 1.8 Vrms in typically 10 msec. This can be accomplished using the PWM control discussed in connection with FIGS. 18 and 19. The drive invert threshold, which determines the PWM level, is stepped from a count of 42 to a count of typically 32. Changing drive levels by ramping rather than sudden large shifts can avoid the sudden application or removal of magnetic field and eliminate the possibility that a nearby object may become magnetized. A transmit resonant circuit Q of typically 95 results in a ramp up to an unloaded resonant voltage across the transmit coil (assuming no battery charging load) of about 170 Vrms. This will couple the needed minimum unloaded receive coil voltage for battery sensing of about 1.7 Vrms up to distances of about 8 cm with the transmit and receive coils preferably aligned, or somewhat less with less preferable alignment. The PWM is held at that drive level for about 10 msec to be sure that the resonances have built up and the receive circuitry has had a chance to respond. If the battery is in need of charging and is within the sensing zone, the battery circuitry will switch the received power on through to the storage cell, suddenly increasing the load on the transmit coil. The program regularly monitors, roughly every 1 msec, the peak transmit resonant circuit voltage through the uComputer A/D input. If the program senses a sudden drop in this voltage, the only likely cause is a battery assembly in need of charging, so the charge cycle routine is entered. Other metallic objects that may arrive in the vicinity will not cause such an action and thus will not initiate charging. If no battery in need of charging is detected at the end of the PWM hold time, the drive invert threshold is stepped back up to 42 in about 10 msec, thus ramping the fundamental drive voltage back down to 0 Vrms. After pausing for about 1 second, the program repeats the detection cycle. The sensing action does not result in large power draw and only occurs for a small fraction of the time, resulting in a very low net non-charge-mode power drain.

Figure 27:
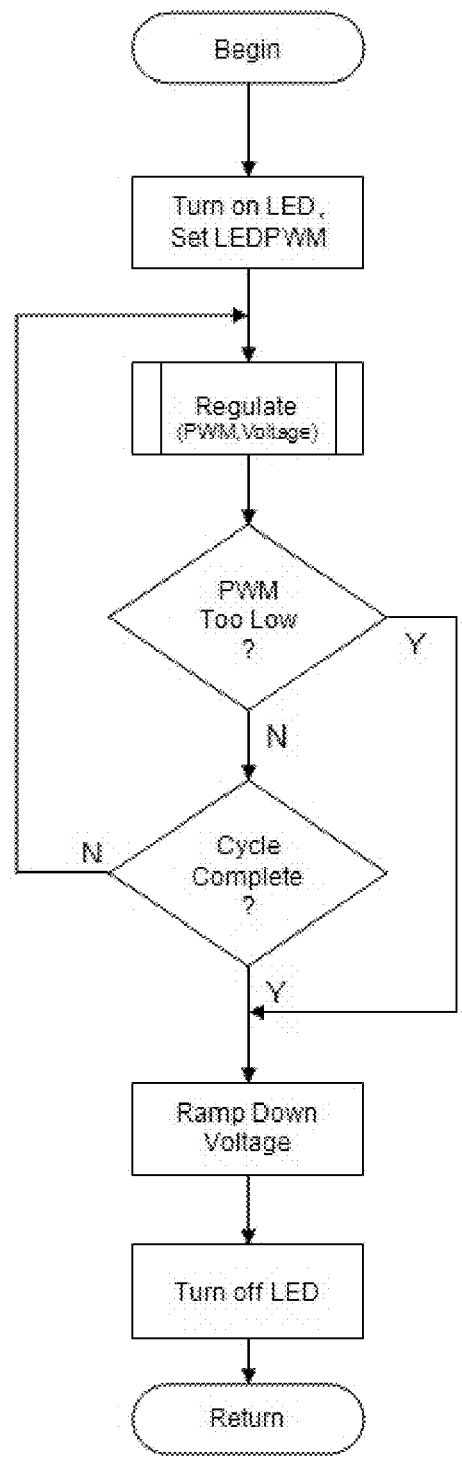
FIG. 27 is a flow diagram of a charge cycle routine used in accordance with embodiments of the present technology.

At the end of the PWM hold time, if a battery in need of charging has been sensed, the charge cycle routine of FIG. 27 is entered. First, the indicator LED is turned on to indicate charging. The regulate routine then determines if more drive can be provided to the transmit coil without exceeding a predetermined maximum drive circuit current. This current can be monitored by reading the resonant circuit peak voltage A/D reading. For example, a peak reading of 240 volts, or 170 Vrms indicates a resonant circuit and drive circuit current of 737 mArms. If the voltage is more than a hysteresis margin lower than this, the drive invert threshold count is lowered to increase the fundamental component of the drive voltage. If the voltage is higher, the opposite action is taken. This regulate cycle is continuously repeated for the duration of the charge cycle routine, typically 5 minutes, for example, at which point, the LED is turned off, the routine is exited, and program execution returns to the main loop of FIG. 26. The drive is then ramped down to 0 Vrms. After a typically 0.25 second pause to allow for resetting of the battery assembly circuitry (specifically, discharge of filter capacitor 123 of FIG. 3), another sense cycle is entered to see if a battery needs further charging.

Beginning with the charging cycle initiation, the LED brightness can be adjusted to indicate the strength of coupling. The brightness can be made inversely proportional to the drive invert threshold, reaching full brightness at a count of 0, representing full square-wave drive. Poorer coupling, potentially caused by more distant battery positioning, for example, can cause the regulate cycle to raise the drive invert threshold count to greater than zero to maintain regulation, resulting in a dimming of the LED. This can be an indication to the user that repositioning of the device to be charged may result in better charging.

When the charging battery is not far from the transmit coil, its coupling and loading can be sufficient such that the PWM can be set to deliver a full square wave (drive invert threshold at a count of 0) without exceeding the drive current limit. The fundamental drive voltage is then at 4.5 Vrms. Especially when multiple batteries are charged simultaneously, the coupling and loading may be sufficiently high such that the drive voltage can be further increased to ensure high battery charge rates without exceeding the drive current limit. If the regulation limit has not yet been reached with a full square drive from a supply voltage of 10 volts, the regulate routine can then direct the off-line supply to step up its high voltage output to as high as typically 40 volts, providing a fundamental drive voltage of up to 18 Vrms. These higher voltages could be used, for example, when four batteries forming a tight magnetic coupling with the transmit coil are being simultaneously charged. The charging field strength can potentially be increased until all the batteries being charged have reached their core saturation levels. At that point, the loading on the transmit coil is significantly reduced, causing more current draw and causing the regulate routine to reduce the drive voltage. Thus, charging can often be maintained on the edge of battery core saturation, about 450 mA charging current for the battery assembly construction according to FIGS. 4, 5, and 6.

A condition that can cause the transmit resonant circuit and associated drive current to exceed the regulation limit happens when the batteries are being removed from the vicinity of the transmit coil. The coupling becomes looser and the transmit coil loading less, increasing the drive current and causing the regulate routine to reduce the drive voltage. First, the supply voltage is reduced down to 10 volts. Then, if voltage should be further reduced, the PWM can be controlled to reduce the fundamental component of the drive voltage further. As this is occurring, the LED is dimmed in proportion to show that the battery positioning is not ideal. At a sufficiently great distance, the fundamental of the drive voltage should be reduced below, for example, 2.0 Vrms (produced by a drive invert threshold count of 30) to keep the drive current under the predetermined limit. If the regulation routine causes the drive invert count to exceed this level, the battery is deemed to have been removed and the charge cycle is exited.

The action of the main loop of FIG. 26 differs from the foregoing description when a dual-wound or triple-wound transmit coil assembly, such as one of those shown in FIGS. 13, 14A, 15A and 15B, for example, is employed. In such cases, a determination can be made as to which coil provides the strongest coupling to the battery or batteries to be charged, and then only the coil providing the strongest coupling can be driven throughout a full charge cycle. The strength of the coupling can be evaluated by examining the drive invert threshold count and the supply voltage reached when a truncated charge cycle regulation routine has stabilized. The main program loop can successively energize each of the two or three coils and perform a detection cycle on each. For each cycle that results in a detected discharged battery, a truncated charge cycle can be performed and the resulting coupling evaluation measurement stored. The results from each coil can be compared and a full charge cycle initiated using only the coil with the strongest coupling.

While particular elements, embodiments and applications of the present invention have been shown and described, it will be understood, that the invention is not limited thereto since modifications can be made by those skilled in the art without departing from the scope of the present disclosure, particularly in light of the foregoing teachings.

What is claimed is:

1. A system for maintaining a drive signal to a resonant circuit at a resonant frequency comprising:
    an oscillator configured to provide an output to a phase comparator and a drive circuit, the drive circuit configured to provide a drive signal to a resonant circuit;
    a phase detector configured to receive a filtered version of the drive signal by sensing a voltage at a junction of an inductor and a capacitor of the resonant circuit and provide a phase-indicating signal to the phase comparator; and
    the phase comparator, wherein the phase comparator is configured to provide a signal based on a phase difference between the oscillator output and the phase-indicating signal, wherein the signal from the phase comparator is used to control the frequency of the oscillator such that the phase difference converges to a fixed value.

2. The system of claim 1, wherein the resonant circuit comprises at least one of a second order low-pass filter and a second order high-pass filter, and wherein the fixed value is 90 degrees, thereby maintaining the drive signal to the resonant circuit that converges to the resonant frequency.

3. The system of claim 2, further comprising an integrator configured to vary a control signal supplied to the oscillator based on the signal provided by the phase comparator, thereby adjusting the oscillator such that there is a phase shift between the oscillator output and the resonant circuit output that converges to ninety degrees, thereby maintaining the drive signal to the resonant circuit that converges to the resonant frequency.

4. The system of claim 3, wherein the integrator has an input-to-output transfer function of a first order integrator.

5. The system of claim 3, wherein the integrator has an input-to-output transfer function of a first order low-pass filter.

6. The system of claim 3, wherein the resonant circuit comprises at least one capacitor effectively in series with an inductor.

7. The system of claim 1, wherein the resonant frequency is in the range of between 15 kHz and 100 kHz.

8. The system of claim 1, wherein the resonant frequency is in the range between 20 kHz and 26 kHz.

9. The system of claim 1, wherein the resonant frequency is greater than 100 kHz.

10. A system for maintaining a drive signal to a resonant circuit at a resonant frequency comprising:
    an oscillator configured to provide an output to a phase comparator, a drive circuit having variable gain, and a low-pass filter, the drive circuit configured to provide a drive signal to a resonant circuit, the low-pass filter having a characteristic frequency that is substantially the same as the resonant frequency of the resonant circuit;

a phase detector configured to receive a filtered signal from each of the low-pass filter and the resonant circuit, and responsively provide a phase-indicating signal to the phase comparator representing the phase of whichever of the phase detector inputs is stronger; and the phase comparator, wherein the phase comparator is configured to provide a signal based on a phase difference between the oscillator output and the phase-indicating signal, wherein the signal from the phase comparator is used to control the frequency of the oscillator.

11. The system of claim 10, further comprising an integrator configured to vary a control signal supplied to the oscillator based on the signal provided by the phase comparator, thereby adjusting the oscillator such that there is phase shift between the oscillator output and the phase-indicating signal that converges to ninety degrees and maintaining the drive signal to the resonant circuit that converges to the resonant frequency.

12. The system of claim 11, wherein the integrator has an input-to-output transfer function of a first order integrator.

13. The system of claim 11, wherein the integrator has an input-to-output transfer function of a first order low-pass filter.

14. The system of claim 10, wherein the resonant circuit comprises at least one capacitor in series with an inductor.

15. The system of claim 10, wherein the resonant frequency is in the range of between 15 kHz and 100 kHz.

16. The system of claim 10, wherein the resonant frequency is in the range between 20 kHz and 26 kHz.

17. The system of claim 10, wherein the resonant frequency is greater than 100 kHz.

18. A method for maintaining a drive signal to a resonant circuit at a resonant frequency comprising:

using an oscillator to provide an output to a phase comparator and a drive circuit, the drive circuit configured to provide a drive signal to a resonant circuit;

using a phase detector to receive a filtered version of the drive signal by sensing a voltage at a junction of an inductor and a capacitor of the resonant circuit and provide a phase-indicating signal to the phase comparator;

using the phase comparator to provide a signal based on a phase difference between the oscillator output and the phase-indicating signal; and using the signal from the phase comparator to control the frequency of the oscillator such that the phase difference converges to a fixed value.

19. The method of claim 18, wherein the resonant circuit comprises at least one of a second order low-pass filter and a second order high-pass filter, and wherein the fixed value is 90 degrees, thereby maintaining the drive signal to the resonant circuit that converges to the resonant frequency.

20. The method of claim 19, further comprising using an integrator to vary a control signal supplied to the oscillator based on the signal provided by the phase comparator, thereby adjusting the oscillator such that there is a phase shift between the oscillator output and the resonant circuit output that converges to ninety degrees, thereby maintaining the drive signal to the resonant circuit that converges to the resonant frequency.

21. The method of claim 20, wherein the integrator has an input-to-output transfer function of a first order integrator.

22. The method of claim 20, wherein the integrator has an input-to-output transfer function of a first order low-pass filter.

23. The method of claim 18, wherein the resonant circuit comprises at least one capacitor effectively in series with an inductor.

24. The method of claim 18, wherein the resonant frequency is in the range of between 15 kHz and 100 kHz.

25. The method of claim 18, wherein the resonant frequency is in the range between 20 kHz and 26 kHz.

26. The method of claim 18, wherein the resonant frequency is greater than 100 kHz.

27. A method for maintaining a drive signal to a resonant circuit at a resonant frequency comprising:

using an oscillator to provide an output to a phase comparator, a drive circuit having variable gain, and a low-pass filter, the drive circuit configured to provide a drive signal to a resonant circuit, the low-pass filter having a characteristic frequency that is substantially the same as the resonant frequency of the resonant circuit;

using a phase detector to receive a filtered signal from each of the low-pass filter and the resonant circuit, and responsively provide a phase-indicating signal to the phase comparator representing the phase of whichever of the phase detector inputs is stronger;

using the phase comparator to provide a signal based on a phase difference between the oscillator output and the phase-indicating signal; and using the signal from the phase comparator to control the frequency of the oscillator.

28. The method of claim 27, further comprising using an integrator to vary a control signal supplied to the controlled oscillator based on the signal provided by the phase comparator, thereby adjusting the oscillator output such that there is a phase shift between the oscillator output and the phase-indicating signal that converges to ninety degrees and maintaining the drive signal to the resonant circuit that converges to the resonant frequency.

29. The method of claim 28, wherein the integrator has the input-to-output transfer function of a first order integrator.

30. The method of claim 28, wherein the integrator has the input-to-output transfer function of a first order low-pass filter.

31. The method of claim 27, wherein the resonant circuit comprises at least one capacitor in series with an inductor.

32. The method of claim 27, wherein the resonant frequency is in the range of between 15 kHz and 100 kHz.

33. The method of claim 27, wherein the resonant frequency is in the range between 20 kHz and 26 kHz.

34. The method of claim 27, wherein the resonant frequency is greater than 100 kHz.

35. The method of claim 27, wherein the phase difference converges to a ninety degree phase shift between the oscillator output and the phase-indicating signal, thereby maintaining the drive signal to the resonant circuit that converges to the resonant frequency.

36. The system of claim 10, wherein the phase difference converges to a ninety degree phase shift between the oscillator output and the phase-indicating signal, thereby maintaining the drive signal to the resonant circuit that converges to the resonant frequency.

* * * * *